(12) United States Patent
Wang et al.

(10) Patent No.: US 10,574,188 B2
(45) Date of Patent: *Feb. 25, 2020

(54) MIXED-SIGNAL POWER AMPLIFIER AND TRANSMISSION SYSTEMS AND METHODS

(71) Applicant: Georgia Tech Research Corporation, Atlanta, GA (US)

(72) Inventors: Hua Wang, Atlanta, GA (US); Fei Wang, Atlanta, GA (US); Song Hu, Atlanta, GA (US); Huy Thong Nguyen, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/157,628

(22) Filed: Oct. 11, 2018

(65) Prior Publication Data

US 2019/0097586 A1 Mar. 28, 2019

Related U.S. Application Data

(63) Continuation of application No. 15/650,818, filed on Jul. 14, 2017, now Pat. No. 10,211,786.

(Continued)

(51) Int. Cl.
*H03F 3/68* (2006.01)
*H03F 1/02* (2006.01)
(Continued)

(52) U.S. Cl.
CPC ......... *H03F 1/0288* (2013.01); *H03F 1/3205* (2013.01); *H03F 3/193* (2013.01);
(Continued)

(58) Field of Classification Search
CPC ................ H03F 1/0288; H03F 3/68
(Continued)

(56) References Cited

U.S. PATENT DOCUMENTS 10,211,786 B2 * 2/2019 Wang ................... H04B 1/0475
2017/0257068 A1 * 9/2017 Hur ...................... H03F 1/0233

OTHER PUBLICATIONS

Hu, Song, A +27.3dBm Transformer-Based Digital Doherty Polar Power Amplifier Fully Integrated in Bulk CMOS, 2014 IEEE Radio Frequency Integrated Circuits Symposium, Mar. 2014, pp. 235-238.
(Continued)

*Primary Examiner* — Steven J Mottola
(74) *Attorney, Agent, or Firm* — Troutman Sanders LLP; Ryan A. Schneider; Christopher C. Close, Jr.

(57) ABSTRACT

The disclosed technology includes device, systems, techniques, and methods for amplifying a complex modulated signal with a mixed-signal power amplifier. A mixed-signal power amplifier may include an input network for splitting an input signal to multiple signals with corresponding phase and amplitude offsets, a main power amplification path including at least an analog power amplifier for amplifying a first signal, one or more auxiliary power amplification paths including at least one digitally controlled analog power amplifier in each path for amplifying a second signal, and an output network for combining the two amplified signals. The main power amplification path and the auxiliary power amplification paths can operate together to achieve load modulation to enhance the overall power amplifier efficiency at power back-off mode and the overall power amplifier linearity. The disclosed technology further includes transmission systems incorporating the mixed-signal power amplifier.

19 Claims, 34 Drawing Sheets

Related U.S. Application Data

(60) Provisional application No. 62/362,086, filed on Jul. 14, 2016.

(51) Int. Cl.

| | | |
|---|---|---|
| *H03F 1/32* | (2006.01) | |
| *H03F 3/193* | (2006.01) | |
| *H03F 3/24* | (2006.01) | |
| *H04B 1/04* | (2006.01) | |
| *H03F 3/45* | (2006.01) | |

(52) U.S. Cl.
CPC ......... *H03F 3/245* (2013.01); *H03F 3/45179* (2013.01); *H04B 1/0475* (2013.01); *H04B 1/0483* (2013.01); *H03F 2200/06* (2013.01); *H03F 2200/318* (2013.01); *H03F 2200/432* (2013.01); *H03F 2200/451* (2013.01); *H03F 2203/45481* (2013.01); *H03F 2203/45621* (2013.01); *H04B 1/04* (2013.01); *H04B 2001/0408* (2013.01)

(58) Field of Classification Search
USPC .............................................. 330/124 R, 295
See application file for complete search history.

(56) References Cited

OTHER PUBLICATIONS

Hu, Song, A Broadband Mixed-Signal CMOS Power AmplifierWith a Hybrid Class-G Doherty EfficiencyEnhancement Technique, IEEE Journal of Solid-State Circuits, Mar. 2016, pp. 598-619, vol. 51, No. 3.

Hu, Song, Design of a Transformer-Based ReconfigurableDigital Polar Doherty Power AmplifierFully Integrated in Bulk CMOS, IEEE Journal of Solid-State Circuits, May 2015, pp. 1094-1106, vol. 50, No. 5.

Hua, Wang, The WirelessWorkhorse, IEEE Microwave Magazine, Oct. 2015, pp. 36-63.

\* cited by examiner

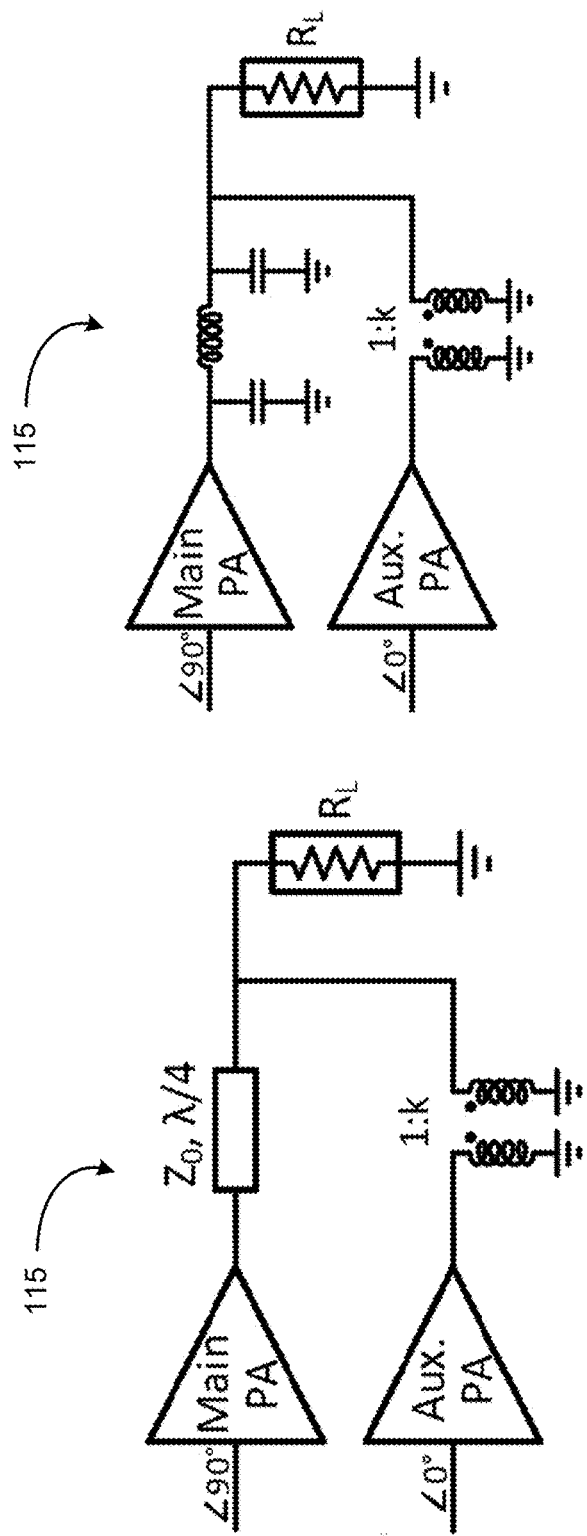
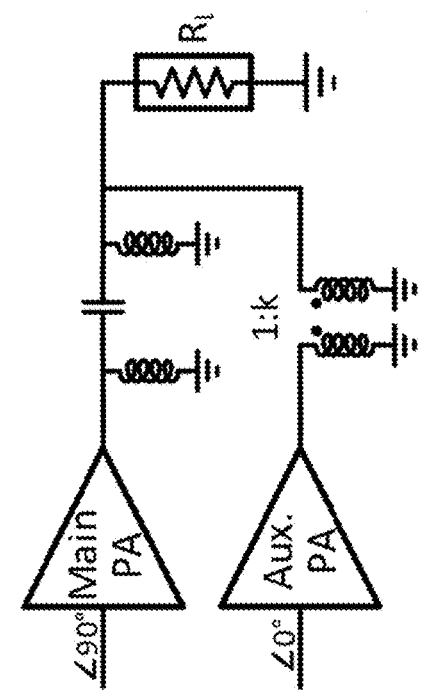
FIG. 10b
FIG. 10c
FIG. 10a

|  | 500MSym/s |
|---|---|
| Lower ACPR | -40.89 dBc |
| Upper ACPR | -44.38 dBc |
| Noise floor | -51.01 dBc |
| EVM | 1.12%(-39.0dBc) |

|  | 1GSym/s |
|---|---|
| Lower ACPR | -38.62 dBc |
| Upper ACPR | -40.29 dBc |
| Noise floor | -53.38 dBc |
| EVM | 1.98%(-34.1dBc) |

# MIXED-SIGNAL POWER AMPLIFIER AND TRANSMISSION SYSTEMS AND METHODS

CROSS-REFERENCE TO RELATED APPLICATIONS

This application claims priority under 35 U.S.C. § 120 to U.S. patent application Ser. No. 15/650,818, filed Jul. 14, 2017, which claims the benefit under 35 U.S.C. § 119(e), of U.S. Provisional Patent Application No. 62/362,086, filed 14 Jul. 2016, the entire contents and substance of which are hereby incorporated by reference as if fully set forth below.

BACKGROUND

With the explosive growth of mobile traffic demand, the contradiction between capacity requirements and spectrum shortage becomes increasingly prominent. The fifth generation (5G) of wireless networks will have to address this problem. An increasingly popular solution is to incorporate the millimeter wave (mmWave) band, which runs from 30 GHz to 300 GHz, into these 5G networks. While the huge bandwidth in the mmWave would allow for accommodation of more mobile traffic, fundamental differences between current systems operating in the microwave band, which runs from 2.4 GHz to 5 GHz, introduce new problems such as high propagation loss, directivity, sensitivity to blockage, and dynamics due to mobility of mmWave communications. In parallel, there is also a rapidly increasing demand on higher data rate for the communication systems in existing GHz frequency regime. All these challenges require new thoughts and insights in architectures and protocols.

The power amplifier (PA) serves as the interface between the radio frequency (RF) transmitter system and the antenna and is often considered one of the most critical building blocks in a wireless network. Due to the PAs effects on the efficiency and linearity of a network, they will play a critical role in the future wireless communication networks operating at the mmWave bands as well as the GHz bands.

Conventional PAs are fully analog PAs, fully digital PAs (DPA), or DPAs with some minor analog linearization. Fully analog PAs are typically employing large power devices and suffer from a direct tradeoff between PA efficiency and linearity performance. As most fully analog PAs are designed to achieve peak efficiency at maximum power output, their power-back off (PBO) operations, which accommodate for the large peak-to-average power ratios (PAPRs) and increase linearity, will degrade the efficiency. Alternatively, fully analog PAs that reduce PBO levels in order to increase efficiency will sacrifice linearity. Moreover, fully analog PAs only allow limited controls on the power cell operations, which restricts their use and achievable performance in various advanced PA architectures, such as Doherty PAs. On the other hand, fully digital PAs are composed of an array of weighted PA cells, and they maintain an advantage over fully analog PAs in that they can precisely control individual PA cells in order to increase the linearity. However, fully digital PAs synthesizes the desired output amplitude purely by digitally controlling the weighted PA cell array, which sets a fundamental limit on the accuracy to interpolate the desired PA output amplitude and the minimal amplitude that the PA can interpolate, i.e. the quantization error that is governed by the least-significant-bit (LSB) of the digital PA cell array. Therefore, to achieve large output dynamic range and low amplitude quantization error, the fully digital PA should employ a large number of weighted PA cells and thus a large number of amplitude control bits. In reality, for high speed modulations, it is increasingly challenging to accurately generate these large number of amplitude control bits and ensure good timing synchronization among them and the synchronization with other signal paths, e.g., the phase modulation path. Any timing mismatch or control bit error will inevitably lead to linearity degradation. In addition, reported DPAs with minor analog linearization only employ analog linearization for the output phase signals, and they are still governed by the aforementioned amplitude quantization errors and output dynamic range set by the finite number of weighted PA cells in the PA.

Therefore, there exists the need for a new PA architecture that can achieve high linearity, high efficiency, and well-controlled PA power cells, whilst employing limited number of control bits, in order to enable the next generation wireless communication systems.

SUMMARY

Some or all of the above deficiencies may be addressed by certain embodiments of the disclosed technology. Disclosed embodiments provide mixed-signal power amplification systems and methods.

Consistent with the disclosed embodiments, the system may include an input network for splitting a complex modulated input signal into at least two signals including a first signal and a second signal. The system may further include a main power amplification path for receiving the first signal that may include at least one analog power amplifier for generating a first amplified signal. The system may further include an auxiliary power amplification path for receiving the second signal that may include one or more digitally controlled power amplifiers for generating a second amplified signal. The system may further include an output network for combining the first amplified signal and the second amplified signal.

In another embodiment, a method is disclosed. The method may include receiving a complex modulated signal by a mixed-signal power amplifier. The method may further include splitting the complex modulated signal into at least two signals including a first signal and a second signal, by an input network. The method may further include generating a first amplified signal by a main power amplification path that includes at least one analog power amplifier, in response to receiving the first signal. The method may further include generating a second amplified signal by an auxiliary power amplification path that includes one or more digitally controlled analog power amplifiers. The method may further include combining the first amplified signal and the second amplified signal by an output network.

In another embodiment, a transmission system is disclosed. The system may include a radio transmitter system for outputting a complex modulated signal. The system may further include a multi-path mixed-signal power amplifier for receiving the complex modulated signal and outputting an amplified output signal. The multi-path mixed-signal power amplifier may include a plurality of mixed-signal power amplifiers arranged in parallel, where each of the plurality of mixed-signal power amplifiers is configured to amplify the frequency of the complex modulated signal to be within a predetermined frequency band such that one and only one of the plurality of mixed-signal power amplifiers processes the complex modulated signal at a time based on a desired output frequency of the amplified output signal. Each mixed-signal power amplifier may include an input network for splitting the complex modulated signal into at least two signals including a first signal and a second signal, a main power amplification path for receiving the first signal and generating a first amplified signal, an auxiliary power amplification path for receiving the second signal and generating a second amplified signal, and an output network for combining the first amplified signal and the second amplified signal into the amplified output signal. The main power amplification path may include at least one analog power amplifier and the auxiliary power amplification path may include one or more digitally controlled analog power amplifiers. The system may further include an antenna for transmitting the amplified output signal.

Other embodiments, features, and aspects of the disclosed technology are described in detail herein and are considered a part of the claimed disclosed technology. Other embodiments, features, and aspects can be understood with reference to the following detailed description, accompanying drawings, and claims.

BRIEF DESCRIPTION OF THE FIGURES

Reference will now be made to the accompanying figures and flow diagrams, which are not necessarily drawn to scale, and wherein:

FIGS. 10A-10C are circuit diagrams of illustrative designs for a broad-band low-loss Doherty output network, according example embodiments.

DETAILED DESCRIPTION

Figure 1:
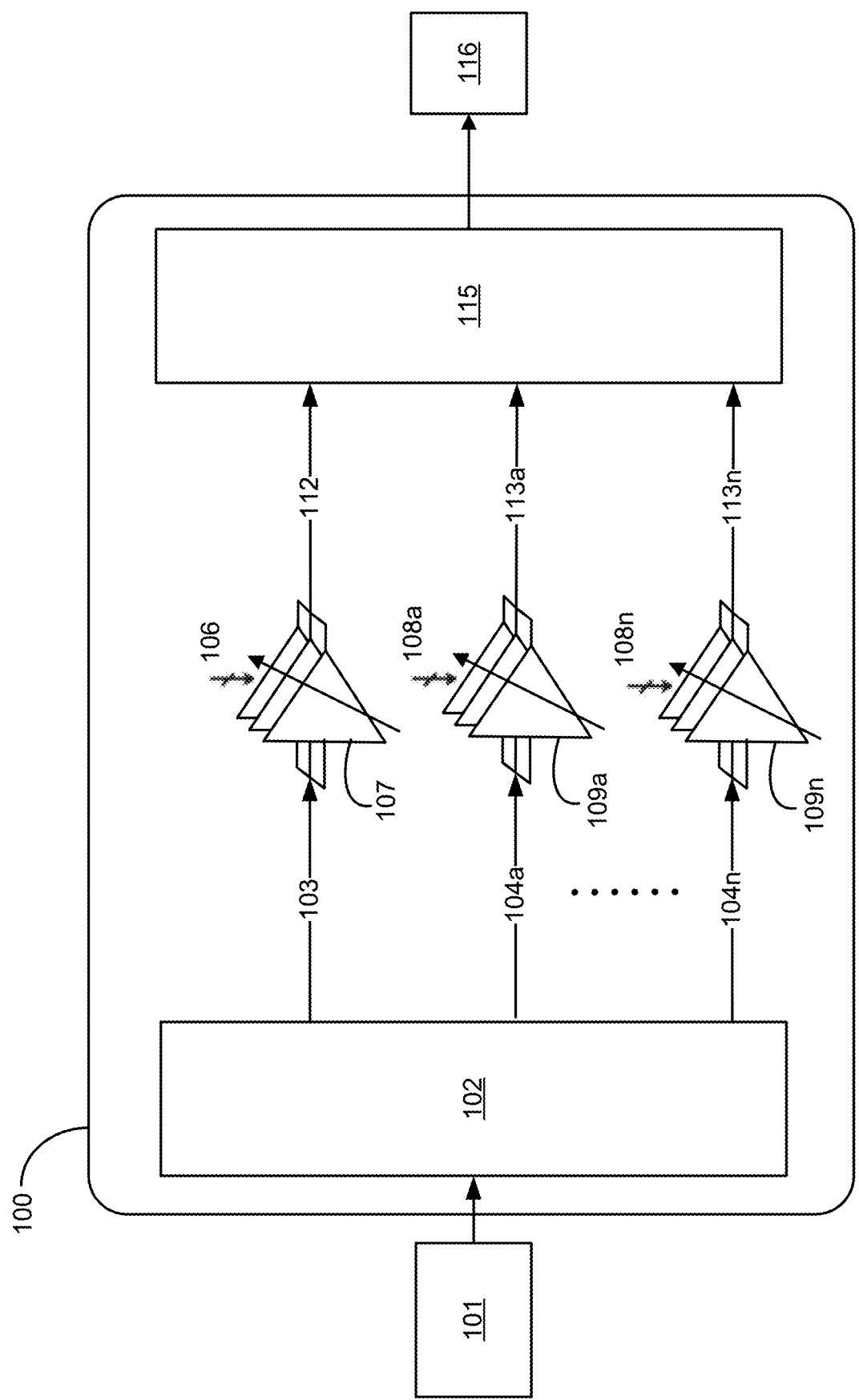
FIG. 1 depicts a block diagram of an illustrative mixed-signal power amplifier, according to an example embodiment.

As described herein, embodiments of the disclosed technology include mixed-signal power amplifiers comprising a main path having at least one analog power amplifier and at least one auxiliary path having at least one digitally controlled analog power amplifier. The main path's analog branch ensures that small-amplitude signals can be accurately amplified, leading to the amplifier having a large dynamic range and small amplitude interpolation errors. When the analog branch gets close to saturation, the digitally controlled analog power amplifiers can be sequentially turned on to ensure that the mixed-signal amplifier maintains high linearity. The digitally controlled analog power amplifiers also allow for precise control of the turning-on point of the auxiliary branches, allowing the devices to be off until needed and therefore allowing for improved linearity. Additionally, this feature allows for reduction of the dc power consumption of the device, therefore substantially increasing device efficiency. The mixed operation of analog power amplifiers and digitally controlled analog power amplifiers also collectively provides the mixed-signal amplifier with the benefit of a being driven by a complex modulated signal, which has varying amplitude. This substantially ensures reduced or no bandwidth expansion of the modulated complex signal. In contrast, existing digital power amplifiers often require polar modulated signals or outphasing modulation signals, which exhibit substantial bandwidth expansion, for example, by ×3 or ×5, and lead to various challenges for high-speed modulations, e.g., 100 MHz to even GHz modulation bandwidth. Moreover, this mixed operation of analog power amplifiers and digitally controlled analog power amplifiers allows for significant reduced bit number requirement of the amplitude control signals compared with conventional digital power amplifiers, since the analog power amplifiers provide fine output amplitude interpolations. This reduction directly simplifies the generation and timing synchronization of these amplitude control signals, which further allows for support of complex modulations with large modulation bandwidths from hundreds of MHz to even GHz range.

Such characteristics and advantages make mixed-signal power amplifiers and devices that incorporate them ideal candidates for inclusion in next generation wireless communication systems to address the rising demand for mobile traffic, such as $5^{th}$ generation (5G) communication, which will likely incorporate high speed modulation and mmWave band carriers running from 30 GHz to 300 GHz. The 28 GHz and 38 GHz bands are specific bands that will likely play a role in future 5G communications devices. While such bands offer the benefit of increased data capacity, they also pose significant challenges for communication systems such as high propagation loss, directivity, sensitivity to blockage, and dynamics due to mobility of mmWave communications. Specifically the high peak efficiency, high linearity, large dynamic range, and support of complex GHz modulation afforded by the proposed mixed-signal power amplifier make it well suited to overcome the challenges of mmWaves. In a certain embodiment of the present invention, a broadband mm-Wave mixed-signal transmitter system that can support multiple GHz bands (28 GHz and 38 GHz) for 5G MIMO communication is presented.

Throughout this disclosure, certain embodiments are described in exemplary fashion in relation to a broadband, linear, and efficient transmitter system. However, embodiments of the disclosed technology are not so limited. In some embodiments, the disclosed technique may be effective in mmWave communication and radar applications. Moreover, embodiments of the disclosed technique may be used in a variety of communication devices, such as smart phones, tablets, 5G MIMO systems such as mobile handsets and basestation units, devices employing Internet-of-Things technology such as nest thermostats, connected appliances, and other similar devices.

Some embodiments of the disclosed technology will be described more fully hereinafter with reference to the accompanying drawings. This disclosed technology may, however, be embodied in many different forms and should not be construed as limited to the embodiments set forth therein.

In the following description, numerous specific details are set forth. However, it is to be understood that embodiments of the disclosed technology may be practiced without these specific details. In other instances, well-known methods, structures, and techniques have not been shown in detail in order not to obscure an understanding of this description. References to "one embodiment," "an embodiment," "example embodiment," "some embodiments," "certain embodiments," "various embodiments," etc., indicate that the embodiment(s) of the disclosed technology so described may include a particular feature, structure, or characteristic, but not every embodiment necessarily includes the particular feature, structure, or characteristic. Further, repeated use of the phrase "in one embodiment" does not necessarily refer to the same embodiment, although it may.

Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

Unless otherwise specified, the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

In some instances, a computing device may be referred to as a mobile device, mobile computing device, a mobile station (MS), terminal, cellular phone, cellular handset, personal digital assistant (PDA), smartphone, wireless phone, organizer, handheld computer, desktop computer, laptop computer, tablet computer, set-top box, television, appliance, game device, medical device, display device, or some other like terminology. In other instances, a computing device may be a processor, controller, or a central processing unit (CPU). In yet other instances, a computing device may be a set of hardware components.

Various aspects described herein may be implemented using standard programming or engineering techniques to produce software, firmware, hardware, or any combination thereof to control a computing device to implement the disclosed subject matter. Of course, a person of ordinary skill in the art will recognize many modifications may be made to the configurations described herein without departing from the scope or spirit of the claimed subject matter.

Various systems and methods, are disclosed for mixed-single power amplification, and will now be described with reference to the accompanying figures.

FIG. 1 depicts a block diagram of illustrative mixed-signal power amplifier 100, according to an example embodiment. As desired, embodiments of the disclosed technology may include a system architecture with more or less of the components illustrated in FIG. 1. It will be understood that the mixed-signal power amplifier 100 is provided for example purposes only and does not limit the scope of the various embodiments of the present disclosed systems and methods.

A mixed-signal power amplifier 100 of FIG. 1 may be used to receive a complex modulated input signal 101, amplify the signal, and produce an output signal 116 having amplified power. As shown in FIG. 1, according to some embodiments, the mixed-signal power amplifier 100 of FIG. 1 may include an input network 102, an output network 115, a main power amplification path 107, and one or more auxiliary power amplification paths 109a-109n. Main power amplification path 107 and one or more auxiliary power amplification paths 109a-109n may contain one or more amplifier stages. Main power amplification path 107 and one or more auxiliary power amplification paths 109a-109n may be referred to as the main path 107 and one or more auxiliary paths 109a-109n, respectively. In some embodiments, main path 107 and one or more auxiliary paths 109a-109n may be arranged in parallel and positioned between input network 102 and output network 115. Main path 107 and one or more auxiliary paths 109a-109n may perform power amplification processes on their respective input signals 103, 104a-104n and output respective amplified output signals 112, 113a-113n. In some embodiments, the power amplifiers in the main path 107 and one or more auxiliary paths 109a-109n may be Doherty power amplifiers. As described in greater detail below, main path 107 and auxiliary paths 109a-109n may include one or more digitally controlled analog power amplifiers that may be selectively switched off and on by respective control signals 106, 108a-108n. According to some embodiments, one or more control signals 106, 108a-108n may be based on the amplitude of the complex modulated input signal 101 received by input network 102 to selectively activate one or more digitally controlled analog power amplifiers. As those of skill in the art would recognize, control signals may be generated based on the amplitude of the complex modulated input signal 101 using, for example, an analog comparator network, a look-up table, a digital microcontroller, or other control methods. In some embodiments, one or more control signals 106, 108a-108n will be based on the amplitude of the complex modulated input signal 101. In other embodiments, digitally controlled analog power amplifiers precisely turned on in order to increase the linearity of the amplifier 100. In other embodiments, digitally controlled power amplifiers may be off until the amplitude of the complex modulated input signal 101 reaches a threshold, in order to increase the efficiency of the amplifier 100. In yet other embodiments, the digitally controlled power amplifiers may all be on in order to allow for ultra-high speed modulation.

Input network 102 may be designed to split or divide a complex modulated input signal 101 into two or more signals with desired phase offsets to be input into the main power amplification path 107 and one or more auxiliary amplification paths 109a-109n. In some embodiments, the input network 102 may employ passive fixed or tunable electronic components, such as capacitors and inductors arranged in series or parallel, passive power dividers, and/or passive phase shifters, to split input signal 101 into multiple signals offset at different phases. In other embodiments, the input network 102 may employ fixed/tunable digital components or active circuits, e.g., active power dividers and/or active phase shifters, to split the input signal 101 with proper phase shift. In other embodiments, the input network 102 can be an N-way power divider, such as for example, a Wilkinson power divider. In other embodiments, the input network 102 can be a quadrature hybrid that splits the input signal 101 to two signals with 90° phase shift. In other embodiments, the input network 102 may employ a combination of fixed/tunable passive components, digital components, and/or fixed/tunable active circuits to split the input signal to multiple signals with certain amplitude and phase offsets. A signal output from input network 102 to main path 107 may be referred to as a main path input signal 103 and one or more signals output from input network 102 to one or more respective auxiliary paths 109a-109n may be referred to as auxiliary path input signal(s). In some embodiments, each of the main path 107 and the one or more auxiliary paths 109a-109n may receive a different signal from input network 102, wherein each signal is offset from the other signals by a phase difference or some amplitude difference. For example, in some embodiments, if mixed-signal power amplifier 100 has a main path 107 and only one auxiliary path 109a, the main path input signal 103 may have a phase that is offset by 90 degrees from the phase of auxiliary path input signal 104a. In embodiments where mixed-signal power amplifier 100 has, for example, a main path 107 and two auxiliary paths 109a, 109b, the phases of the main path input signal 103, and each of the auxiliary path input signals 104a, 104b may be offset such that the each signal has a different phases. As those of skill in the art will recognize, the phase differences between the various input signals 103, 104a-104n may depend on the total number of paths (i.e., the main path plus the number of auxiliary paths) present in the mixed-signal power amplifier 100 and the desired operation of the mixed-signal power amplifier. In some embodiments, the input network 102 may employ digital components or active circuits to split the input signal 101 and achieve static or real-time tuning of the phase offsets or amplitude differences among the main power amplification path 107 and one or more auxiliary amplification paths 109a-109n.

According to some embodiments, mixed-signal power amplifier 100 may provide beneficial signal amplification properties because it provides a main path 107 having an analog power amplifier and at least one auxiliary path 109a having a digitally controlled analog power amplifier. This design may be beneficial because input signals having an amplitude below a predefined threshold may be processed by the main path 107 with high linearity whereas input signals having an amplitude above a predefined threshold in which an analog power amplifier may experience a degradation of the signal due to clipping, may be beneficially amplified by one or more auxiliary paths 109a-109n including digitally controlled power amplifiers that are better suited to handle signals of a higher amplitude.

An output network 115 may be designed to combine the amplified signals 112, 113a-113n that are output by the main path 107 and one or more auxiliary paths 108a-108n, respectively. In some embodiments, the output network 115 may employ passive fixed or tunable electronic components such as capacitors, inductors, and transmission lines arranged in series, parallel or hybrid configurations to combine amplified signals 112, 113a-113n. In other embodiments, the output network 115 may employ fixed/tunable digital components or fixed/tunable active circuits to combine the amplified cells. According to some embodiments, the design of output network 115 may vary based on the particular implementation of the main path 107 and the one or more auxiliary paths 109a-109n. For example, differing numbers of auxiliary paths 109a-109n and/or differing numbers or configurations of power amplifiers included within the main path 107 and/or the one or more auxiliary paths 109a-109n may affect the design of output network 115 in order to ensure that it properly combines the amplified signals. In other embodiments, the output network 115 may employ load modulation networks. As described in greater detail below with respect to FIGS. 8-10C, various embodiments of output network 115 may include Doherty output networks 115 that are composed of transformers, transmission lines, inductors, capacitors, resistors, tunable transformers, tunable transmission lines, tunable inductors, tunable capacitors, tunable resistors, and switches. In other embodiments, the Doherty networks may have two or multiple inputs.

Figure 2:
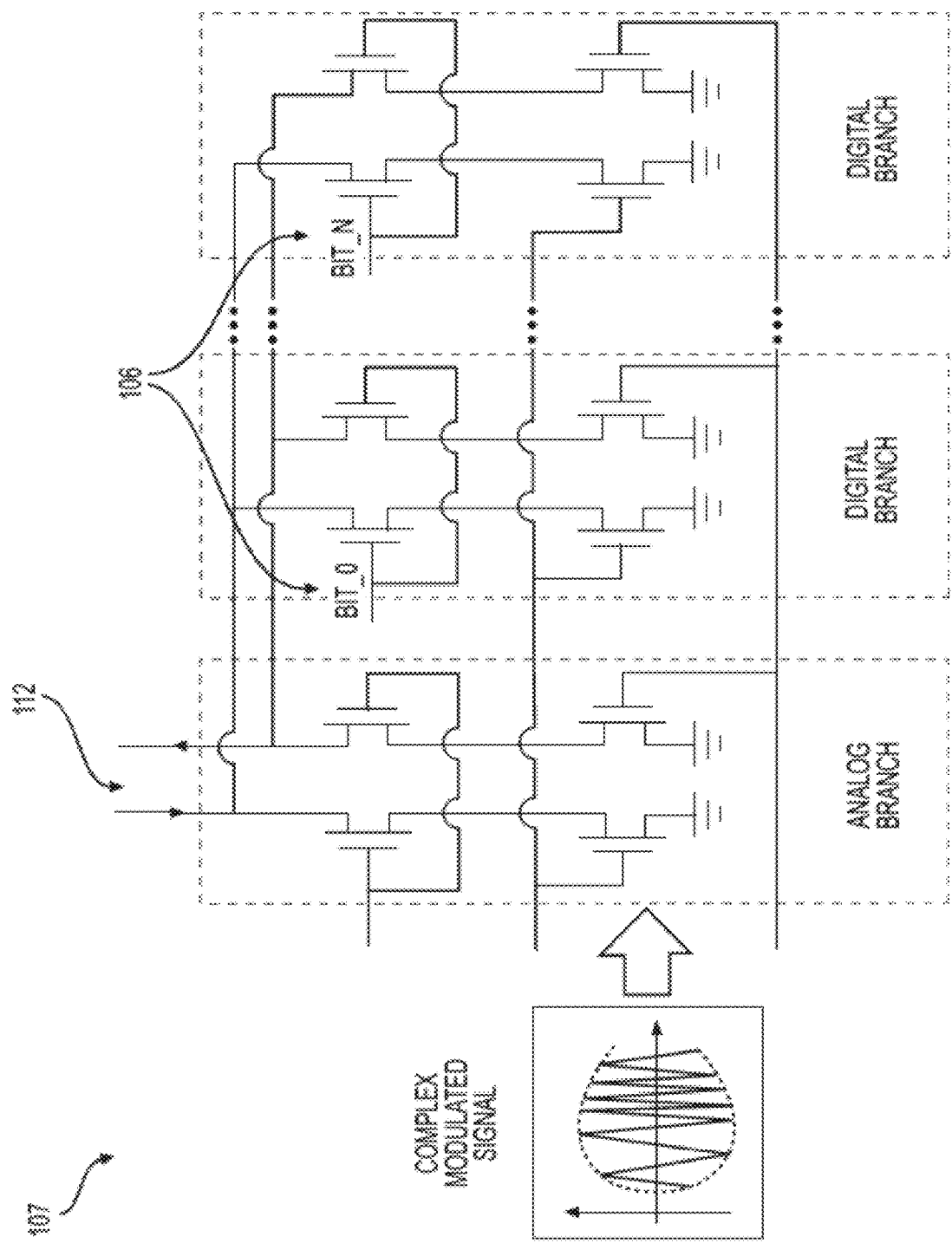
FIG. 2 is a circuit diagram of an illustrative main path of a mixed-signal power amplifier, according to an example embodiment.

As shown in FIG. 2, an example embodiment of main path 107 may include an analog power amplifier (which may be referred to as an analog branch). In some embodiments, as further shown in FIG. 2, a main path 107 may include one or more digitally controlled analog power amplifiers (which may be referred to as digital branches) in parallel with the analog power amplifier. Although FIG. 2 depicts an example embodiment of a main path 107 having one analog power amplifier and N number of digitally controlled analog power amplifiers, it should be understood that in some embodiments, a main path 107 may not include any digitally controlled analog power amplifiers, but may simply include a single analog power amplifier. It should also be understood that in some embodiments, a main path 107 may not include any analog power amplifier, but may only include multiple digitally controlled analog power amplifiers. Further, in some embodiments, a main path 107 may include a plurality of analog power amplifiers. Thus, in various embodiments, a main path 107 may include an analog power amplifier arranged in parallel with any number of other analog power amplifiers and/or any number of digitally controlled analog power amplifiers. As will be understood by those of skill in the art, the analog power amplifier may operate continuously to amplify input signals 101 with low amplitude while the one or more digitally controlled analog power amplifiers may be switched off and until turned on by one or more control signals 106. This allows for improved efficiency of the system because while the digitally controlled analog power amplifiers are off, dc power consumption is reduced. This also allows for improved linearity of the system because turning on the digitally controlled analog power amplifiers will extend the linearity range of the overall amplifier. In some embodiments, the number of bits of turned-on digitally controlled analog power amplifiers is determined by the amplitude of the input signal 101 and controlled by control signals 106.

Figure 3:
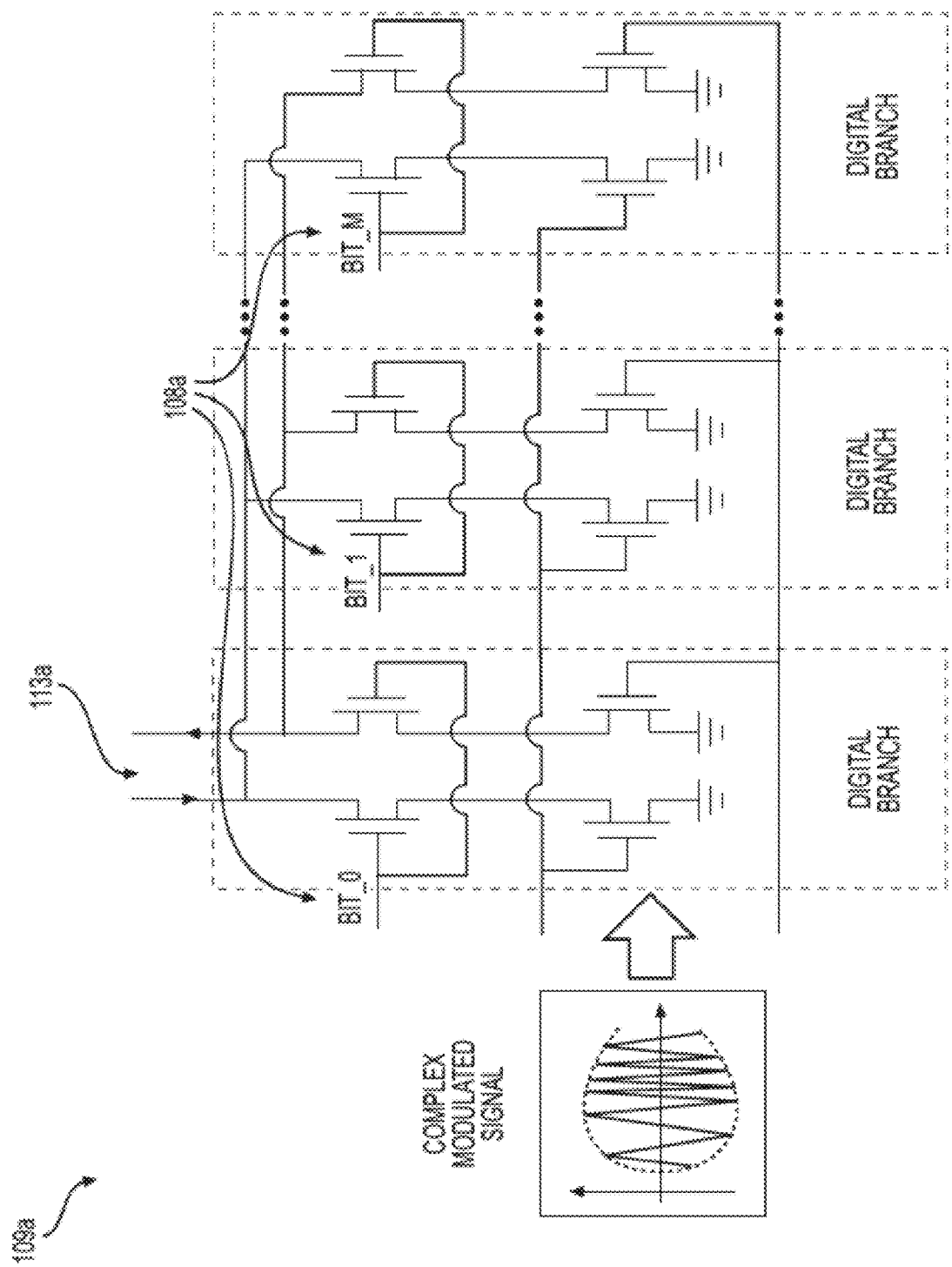
FIG. 3 is a circuit diagram of an illustrative auxiliary path of a mixed-signal power amplifier, according to an example embodiment.

As shown in FIG. 3, an example embodiment of auxiliary path 109a may include one or more digitally controlled analog power amplifiers arranged in parallel. As previously discussed above, the one or more digitally controlled analog power amplifiers in an auxiliary path 109a may be designed to amplify an auxiliary path input signal 104a that has a higher amplitude than an analog power amplifier can handle without degradation. According to some embodiments, and as shown in FIG. 3, an auxiliary path 109a may include at least one digitally controlled analog power amplifier positioned in parallel with any number of additional digitally controlled analog power amplifiers. Thus, in some embodiments, an auxiliary path 109a may include a single digitally controlled analog power amplifier, and in some embodiments an auxiliary path 109a may include a plurality of digitally controlled analog power amplifiers. In some embodiments, an auxiliary path 109a may also include one or more analog amplifiers. The digitally controlled analog power amplifiers may operate in a similar manner to those described above with respect to FIG. 2, and they may be selectively turned off and on in response to control signals 109a. Although not depicted in FIG. 3, according to some embodiments, an auxiliary path 109a may also include an analog power amplifier in parallel with the one or more digitally controlled analog power amplifiers.

Although the preceding description of FIG. 3 pertains to a single auxiliary path 109a, it should be understood that there may be multiple other auxiliary paths 109b-109n that may include any of the designs described with respect to FIG. 3. For example, in some embodiments, a mixed-signal power adapter may include a plurality of auxiliary paths 109a-109n having the same or similar designs to one another. According to some embodiments, a mixed-signal power adapter may include a plurality of auxiliary paths 109a-109n having different designs from another. For example, a first auxiliary path 109a may only have a single digitally controlled analog power amplifier, a second auxiliary path 109b may have a plurality of digitally controlled analog power amplifiers, and a third auxiliary path 109c may have an analog power amplifier and one or more digitally controlled analog power amplifiers. As will be appreciated, there may be many different combinations of auxiliary path 109a designs. Furthermore, embodiments a mixed-signal power amplifier 100 may have different designs based on the inclusion of different numbers of auxiliary paths 109a-109n, as well as differing particular designs of the main path 107 and respective auxiliary paths 109a-109n (i.e., how many power amplifiers and of which types a particular main path 107 or auxiliary path 109a-109n has). For example, in some embodiments, a mixed-signal power amplifier 100 may have a main path 107 that only includes analog power amplifier components and one or more auxiliary paths 109a-109n that only include digitally controlled analog power amplifiers. However, in some embodiments, a mixed-signal power amplifier 100 may have a main path 107 and one or more auxiliary paths 109a-109n that include both analog power amplifier components and digitally controlled analog power amplifiers.

Figure 4:
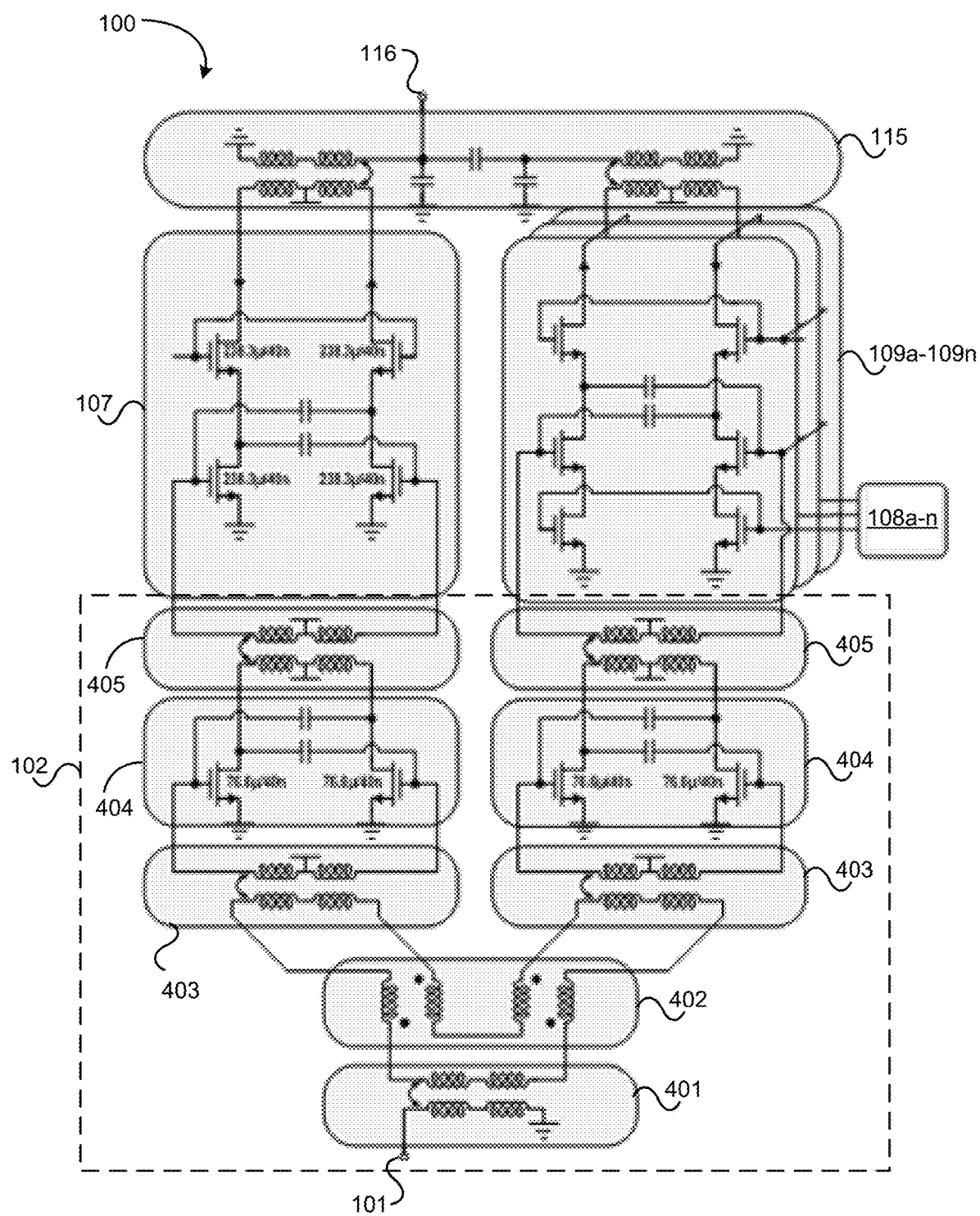
FIG. 4 is a circuit diagram of an illustrative mixed-signal power amplifier, according to an example embodiment.

FIG. 4 is a circuit diagram of an illustrative mixed-signal power amplifier 100, according to an example embodiment. The circuit diagram shown in FIG. 4 provides a more detailed example embodiment of the block diagram shown in FIG. 1. As shown in FIG. 4, according to some embodiments, the input network 102 of a mixed-signal power amplifier 100 may include an input balun 401, a differential quadrature hybrid 402, a pair of matching networks 403, a pair of drivers stages 404, and a pair of interstage matching networks 405. According to some embodiments the input balun 401 may be made from passive components such as inductors and capacitors that are configured to receive the complex modulated input signal 101 and [split the input signal into two or multi ways]. The output of the input balun 401 may feed into the input of the differential quadrature hybrid 402, which may be made from passive components such as inductors and capacitors that are configured to split the signal into two signals that are separately received by the pair of matching networks 403. In some embodiments, the quadrature hybrid 402 achieves desired 90° phase shift. In some embodiments, the matching networks 403 may be made of passive components such as inductors and capacitors that match the impedance of differential quadrature hybrid to the driver input impedance and then outputs each signal to one of the pair of drivers stages 404. Each of the drivers 404 may be made from power cells/transistors that are configured to amplify the respective signals and then output each signal to one of the pair of interstage matching networks 405. In some embodiments, the interstage matching networks 405 may be made from passive components such as inductors and capacitors that are configured to match the PA input impedance to the desired driver load impedance before outputting a main path input signal 103 to the main path 107 and one or more auxiliary path input signals 104a-109n to one or more auxiliary paths 109a-109n. As previously described above, the main path 107 and one or more auxiliary paths 109a-109n may amplify the signals using a combination of at least one analog power amplifier and one or more digitally controlled analog power amplifiers that are selectively turned off and on by one or more associated control signals 108a-108n. The amplified signals are then received by output network 115, which according to some embodiments may be made of passive components such as inductors and capacitors that are configured to combine the amplified signals into a single output signal 116. According to some embodiments, the output network 115 may be a Doherty combiner network. In other embodiments, the output network 115 may be a general output combining network. In some embodiments, the output network 115 may have different designs, such as for example the output network designs shown in FIGS. 8-10C.

Figure 5:
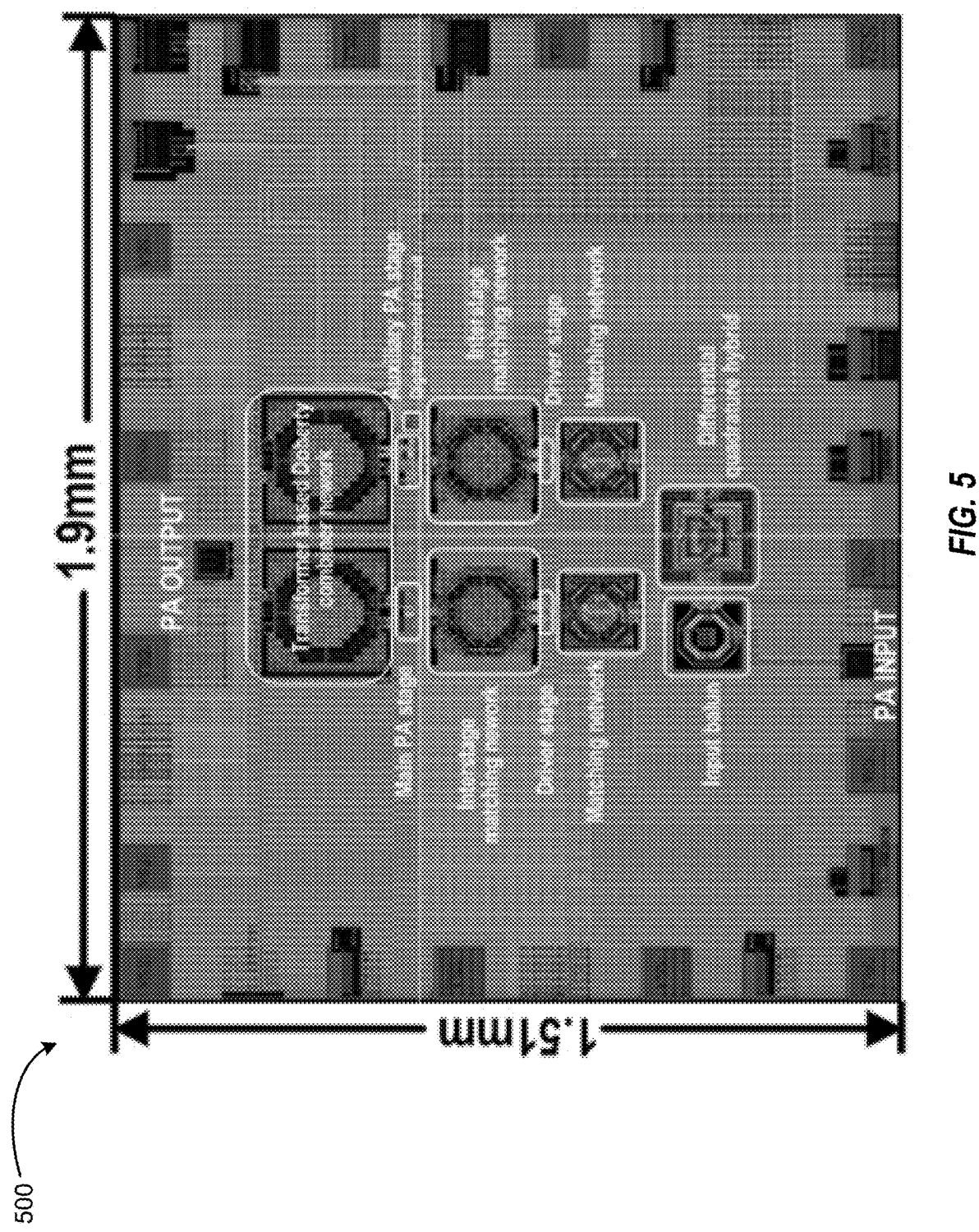
FIG. 5 is a chip layout of an illustrative mixed-signal power amplifier, according to an example embodiment.
Figure 6:
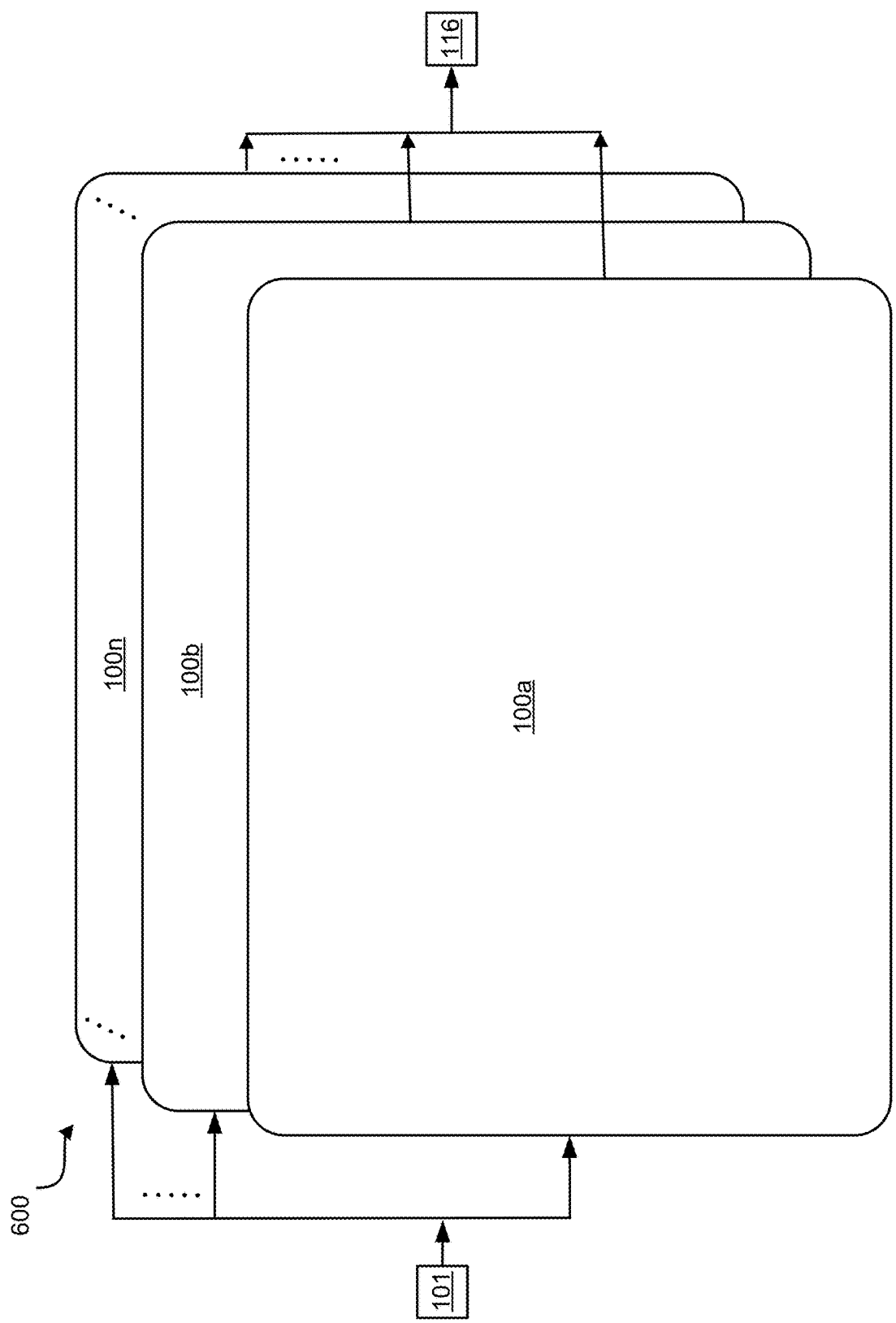
FIG. 6 is a block diagram of an illustrative multi-path mixed-signal power amplifier, according to an example embodiment.

FIG. 5 is a layout of a chip 500 that includes an illustrative mixed-signal power amplifier 100, according to an example embodiment. A chip 500 may be a chip in a GF45 nm CMOS SOI process with the mixed-signal PA architecture implemented on it. As will be appreciated by those will skill in the art, the chip 500 may be a chip formed from other materials and in manufacturing processes. As shown, the chip 500 may include features that correspond to the features shown in FIG. 4. For example, the chip 500 may include an input network 102 including an input balun 401, a differential quadrature hybrid 402, a pair of matching networks 403, a pair of driver stages 404, and a pair of interstage matching networks 405. The chip 500 may further include a main power amplification path 107 and one or more auxiliary power amplification paths 109a-109n. Further, the chip 500 may include an output network 115, such, for example as a transformer-based Doherty combiner network. Because the mixed-signal power amplifier 100 may be fitted onto a chip 500 that may be, for example but not limited to, a rectangular chip that is 1.51 mm by 1.9 mm in size, the chip or chips 500 may be well-suited for use in cell phones, base stations, radar equipment used in vehicles, and other communication devices used in various wireless communication systems, such as 5G communication. FIG. 6 shows an example embodiment of a multi-path mixed-signal power amplifier 600 that incorporates a plurality of mixed-signal power amplifiers 100a-100n, as described with respect to FIG. 1 above. In some embodiments, a plurality of mixed-signal power amplifiers 100a-100n of a multi-path mixed-signal power amplifier 600 may be arranged in parallel to one another, such that they all receive the same complex modulated input signal 101. A multi-path mixed signal power amplifier 600 may be used to boost the total output power of the power amplifier. A multi-path mixed signal power amplifier 600 may also be used to amplify the frequency of a complex modulated input signal to be in a predetermined frequency band associated with one of the plurality of mixed-signal power amplifiers 100a-100n. In other words, each of the plurality of mixed-signal power amplifiers 100a-100n may have an associated desired output frequency band. A particular mixed-signal power amplifier 100a that processes a complex modulated input signal may amplify the frequency of the complex modulated input signal to fall within the associated desired output frequency band. For example, in one embodiment, a multi-path mixed-signal power amplifier 600 may have a first mixed-signal power amplifier 100a with an associated desired output frequency band of 28 GHz and a second mixed-signal power amplifier 100b with an associated desired output frequency of 38 GHz. Accordingly, if the output signal is desired to have a frequency in the 28 GHz band then the first mixed-signal power amplifier 100a will process the complex modulated input signal 101, but if the output signal is desired to have a frequency in the 38 GHz band then the second mixed-signal power amplifier 100b will process the complex modulated input signal 101. Accordingly, when a complex modulated input signal 101 is received by the multi-path mixed-signal power amplifier 600, it may be selectively processed and/or amplified by either the first or the second mixed-signal power amplifiers 100a, 100b, based on the desired output frequency for transmission. Accordingly, in some embodiments, only one mixed-signal power amplifier 100a-100n of the plurality may process and/or amplify the input signal 101 to generate an amplified output signal 116 at a time.

Figure 7:
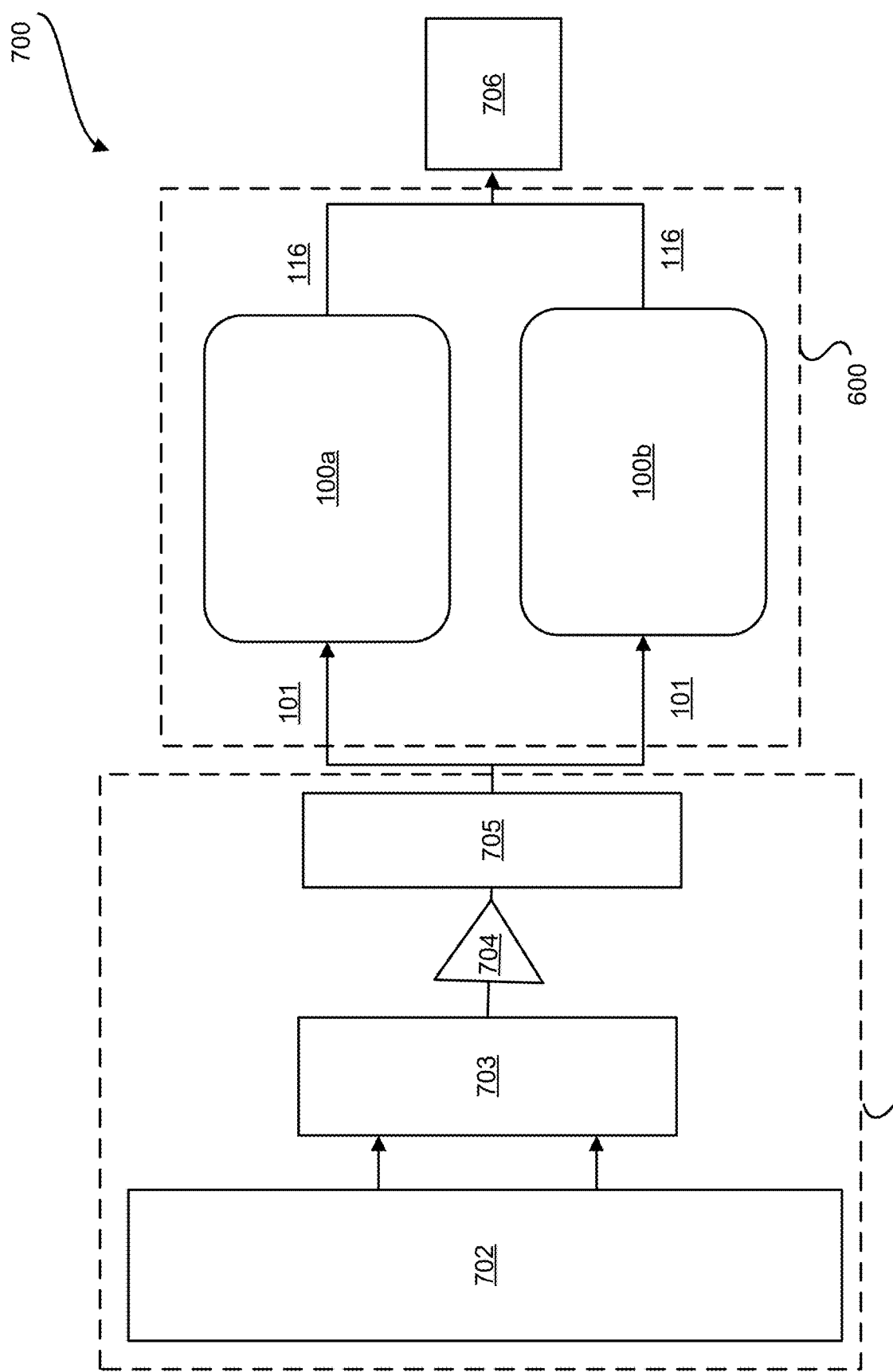
FIG. 7 is a block diagram of an illustrative transmission system utilizing two mixed-signal power amplifiers, according to an example embodiment.

According to some embodiments, one or more mixed-signal power amplifiers 100 of the present disclosure may be utilized in a transmission system. For example, FIG. 7 shows a block diagram of an illustrative transmission system 700 including two mixed-signal power amplifiers 100a,100b according to an example embodiment. The transmission system 700 may include a radio frequency (RF) transmitter system 701, a multi-path mixed-signal power amplifier 600 as previously described in FIG. 6, and an antenna 706 for transmitting an amplified output signal. According to some embodiments, the transmitter system 700 may generate or output a complex modulated signal that may be processed and amplified by the multi-path mixed-signal amplifier 600 to generate an amplified output signal as described above with respect to FIG. 6. According to some embodiments, transmitter system 701 may include an external baseband generation unit 702 for generating an amplitude-varying complex modulated signal, a coupler 703 for providing power splitting and desired phase offsets or amplitude differences among the power amplifier paths, a driver 704 for communication of the digital signal across circuit traces, and a broadband power divider 705 for splitting the input signal into separate signals offset by some phase angle.

Figure 8:
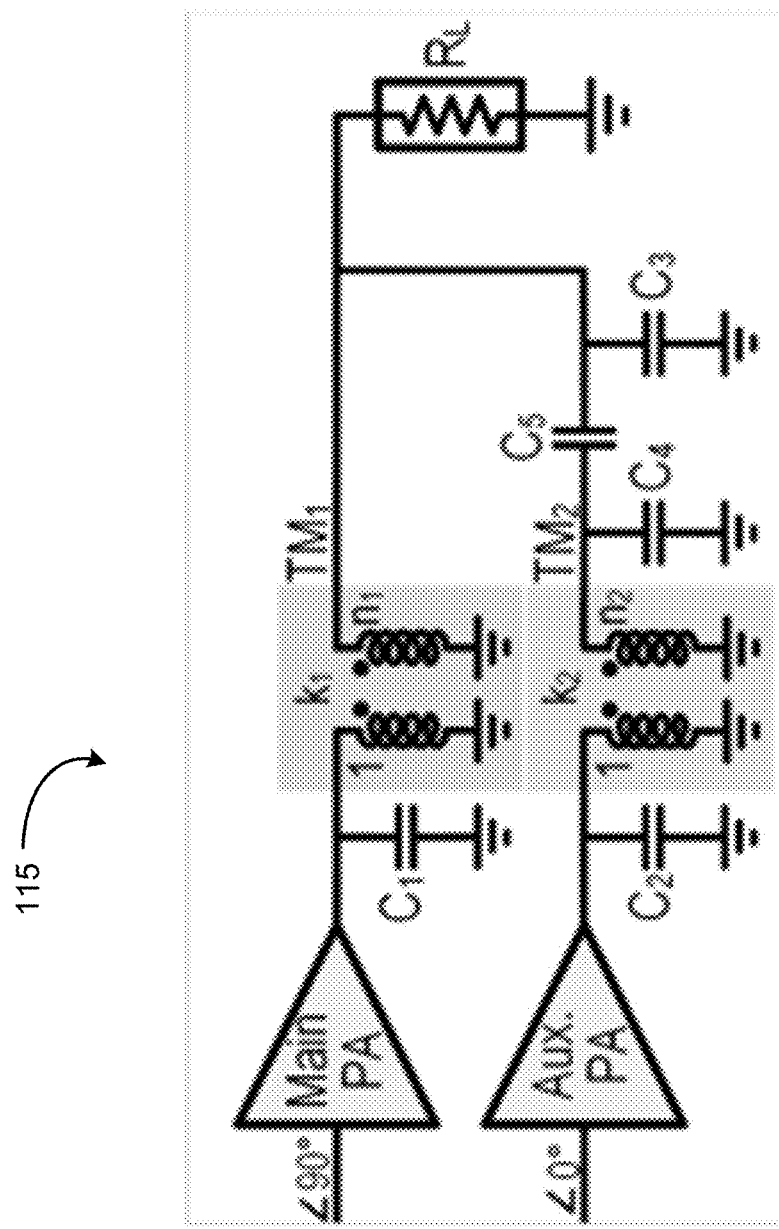
FIG. 8 is a circuit diagram of an illustrative transformer-based Doherty output network, according to an example embodiment.
Figure 9:
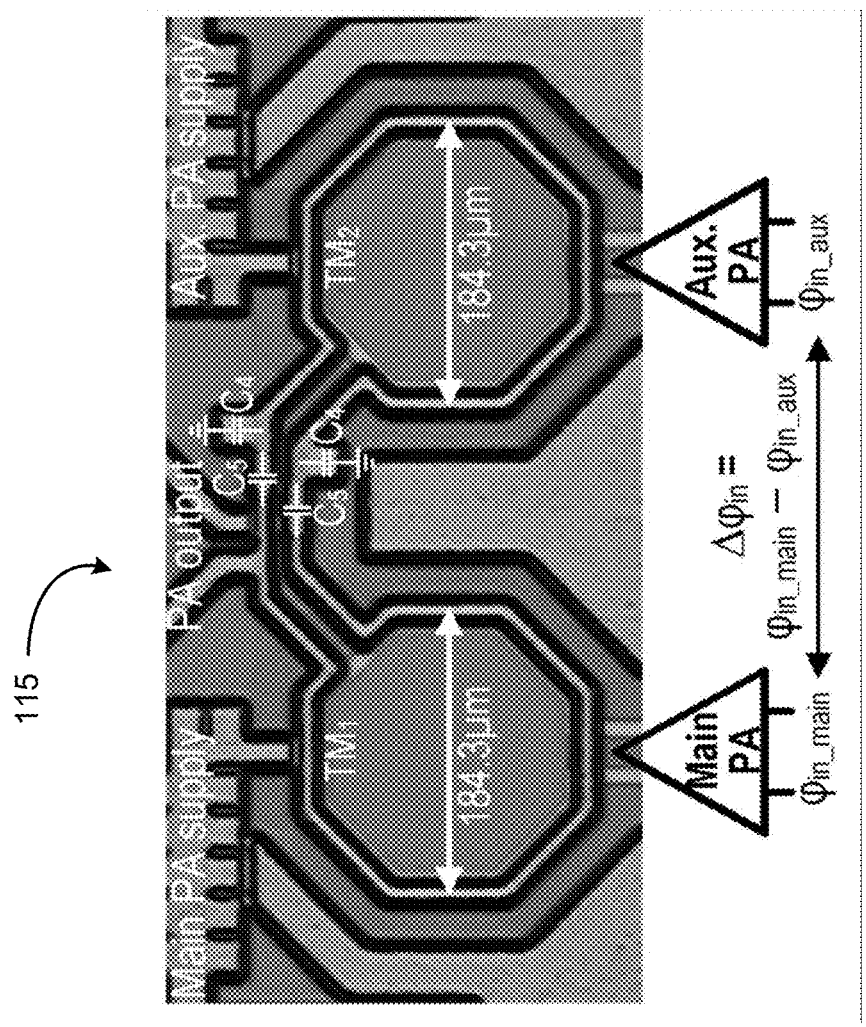
FIG. 9 is a chip layout of an illustrative transformer-based Doherty output network, according to an example embodiment.

FIGS. 8 and 9 show a circuit diagram and a chip layout of an illustrative transformer-based Doherty output network 115, respectively, according to an example embodiment. The transformer-based Doherty output network 115 is designed such that it may be compact. In some other embodiments, the transformer-based Doherty output network 115 is designed such that it may have reduced impedance transformation ratio and high passive efficiency at power back off. In some other embodiments, the transformer-based Doherty output network 115 is designed such that it may have true Doherty load modulation. In some other embodiments, the transformer-based Doherty output network 115 is designed such that it may have support large modulation bandwidth. Some other embodiments may combine some or all of these design elements.

FIGS. 10A-10C are circuit diagrams of illustrative designs for a broad-band low-loss Doherty output network 115, according to example embodiments. FIG. 10A shows an output network design 115 that uses quart-wavelength transmission line and transformer. FIG. 10B shows an output network design 115 that uses C-L-C synthesized network and transformer. FIG. 10C shows an output network design 115 that uses L-C-L synthesized network and transformer.

In some embodiments, one or more mixed-signal power amplifiers 100 employ input network 102, main path 107, auxiliary path 109a-109n, and output network 115, and these components are designed and operated in the ways that the outputs 112-113n achieve load modulation operations to substantially extend the power amplifier efficiency at the power back-off (PBO) and the power amplifier linearity. Exemplary load modulation operations may include Doherty operation and outphasing operation.

In some embodiments, one or more mixed-signal power amplifiers 100 can be co-implemented and co-operated with other power amplifier architectures, such as envelope tracking (ET) and Envelope Elimination and Restoration (EER) power amplifier architectures.

In some embodiments, one or more mixed-signal power amplifiers 100 can employ tunable circuits such as switch-controlled capacitor banks, varactors, and varactor controlled banks, which are controlled by the input amplitude varying signals or the control signals that are used to control the digitally controlled analog power amplifiers, so that the amplitude (AM-AM) or phase (AM-PM) linearity of the overall amplifier can be improved in static and averaged operation or real-time operation to track the modulation symbols.

In some embodiments, one or more mixed-signal power amplifiers 100 can employ Doherty output network and implemented as mixed-signal Doherty power amplifiers. A main path 107 may include the analog power amplifier. In some embodiments, a main path 107 may also include one or more digitally controlled analog amplifiers. An auxiliary path 109a may include a single digitally controlled analog power amplifier, and in some embodiments an auxiliary path 109a may include a plurality of digitally controlled analog power amplifiers. During the low power region, digitally controlled analog power amplifiers in auxiliary paths 109a-109n are turned off to save the dc power and to achieve high efficiency. The input signal can be accurately amplified by the analog power amplifier in the main path 107, leading to a large dynamic range. During the high-power region, digitally controlled analog power amplifiers in auxiliary paths 109a-109n may be sequentially turned on to ensure linear power gain interpolation, which substantially increases the linearity. The turning-on point of digitally controlled analog power amplifiers in auxiliary paths 109a-109n can be precisely controlled to achieve ideal Doherty load modulation, which substantially increases the efficiency.

Experimental Results

An example architecture similar to that shown in FIG. 1 served as a test system comprising a mixed-signal Doherty PA architecture having a main path comprising one analog branch and a single auxiliary path comprising 4 bits or 16 binary-weighted digitally controlled branches. Simulations were performed on this system at 5 GHz operation using a real transistor in a GF45 nm CMOS SOI process and an ideal lossless Doherty network. FIG. 11A-FIG. 14B show the results of the simulations of the example architecture.

Figure 11A:
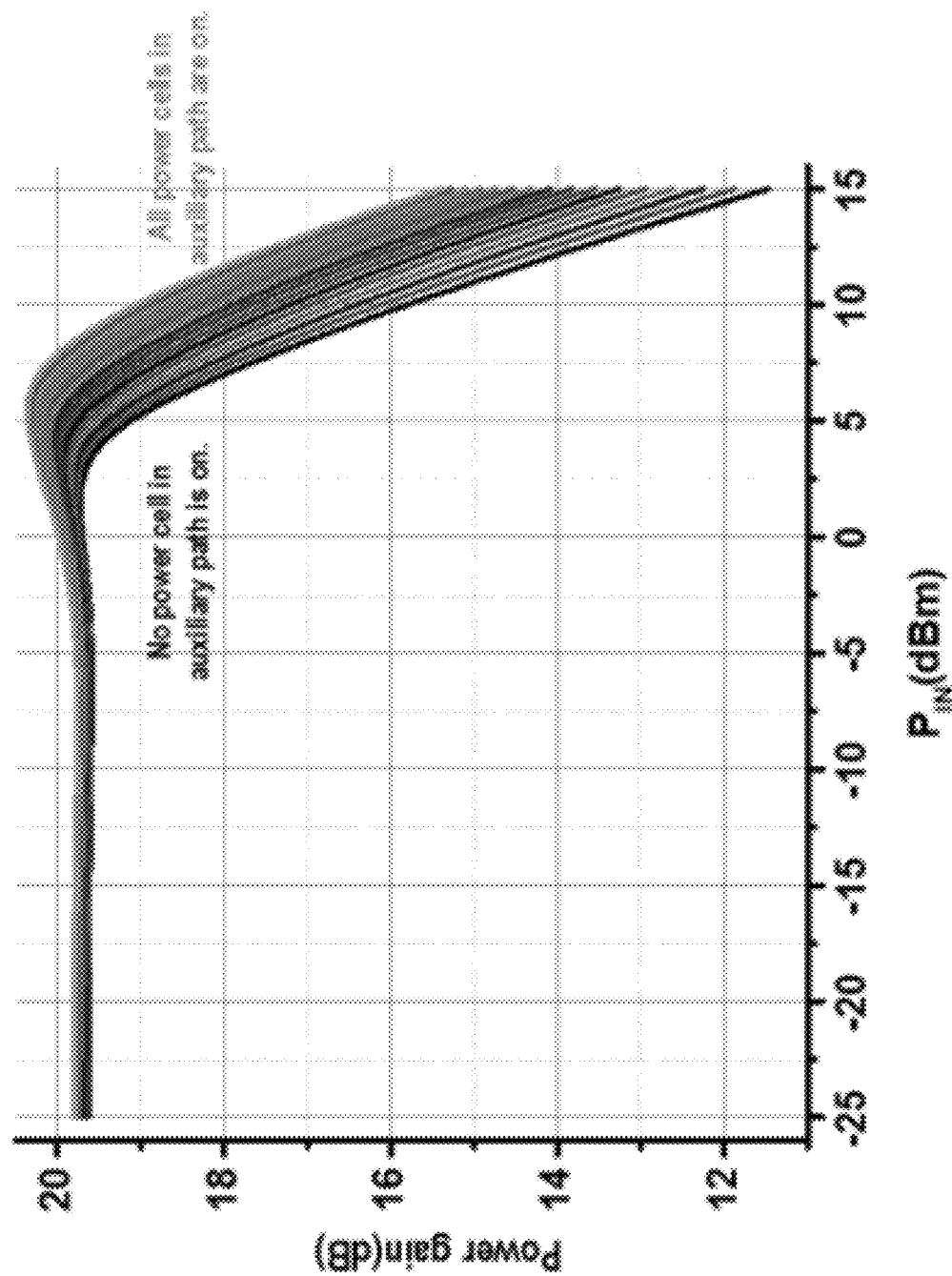
FIGS. 11A-B are charts depicting the simulated power gain of a mixed-signal Doherty PA operating at 5 GHz, according to an example embodiment.
Figure 11B:
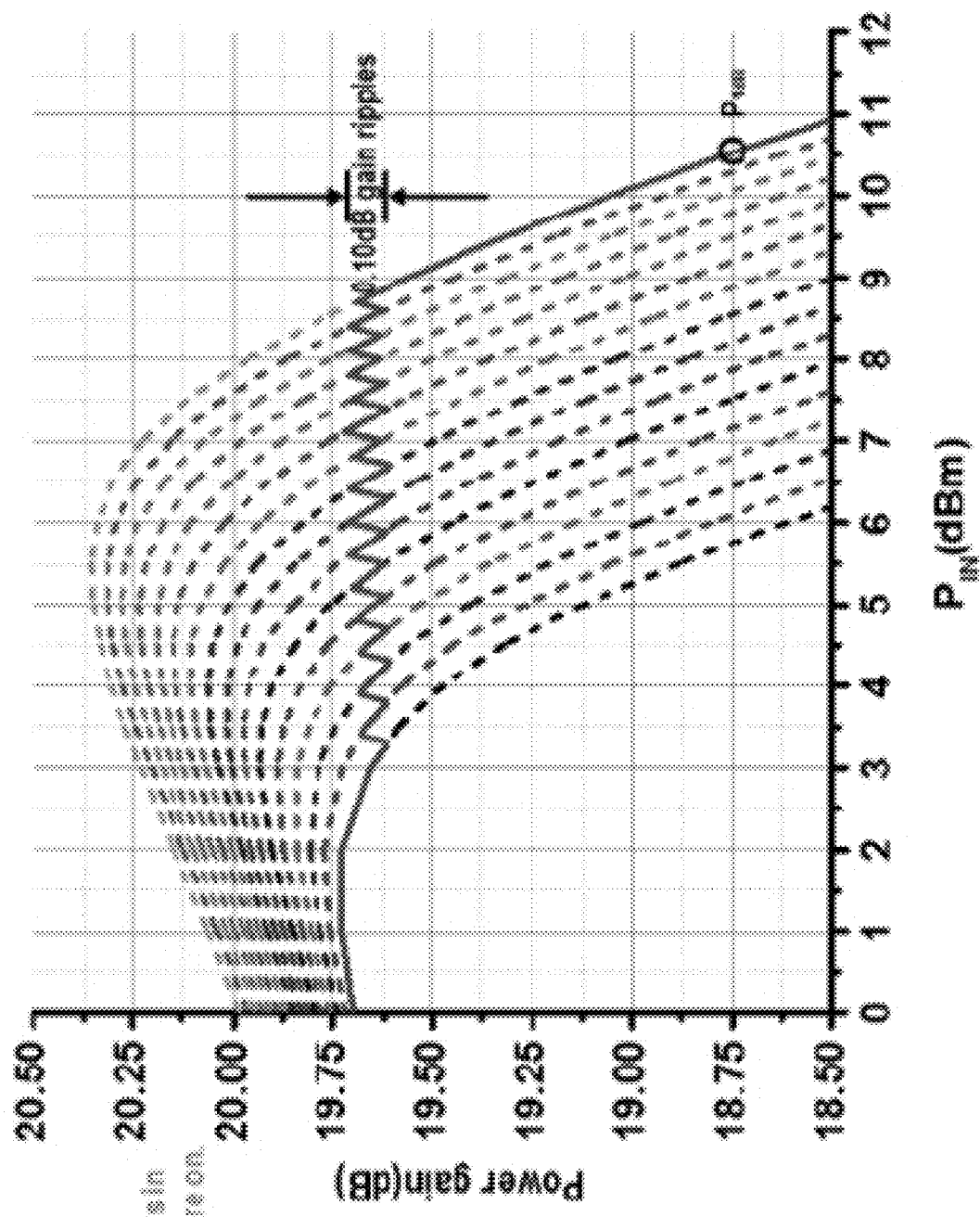
Figure 12:
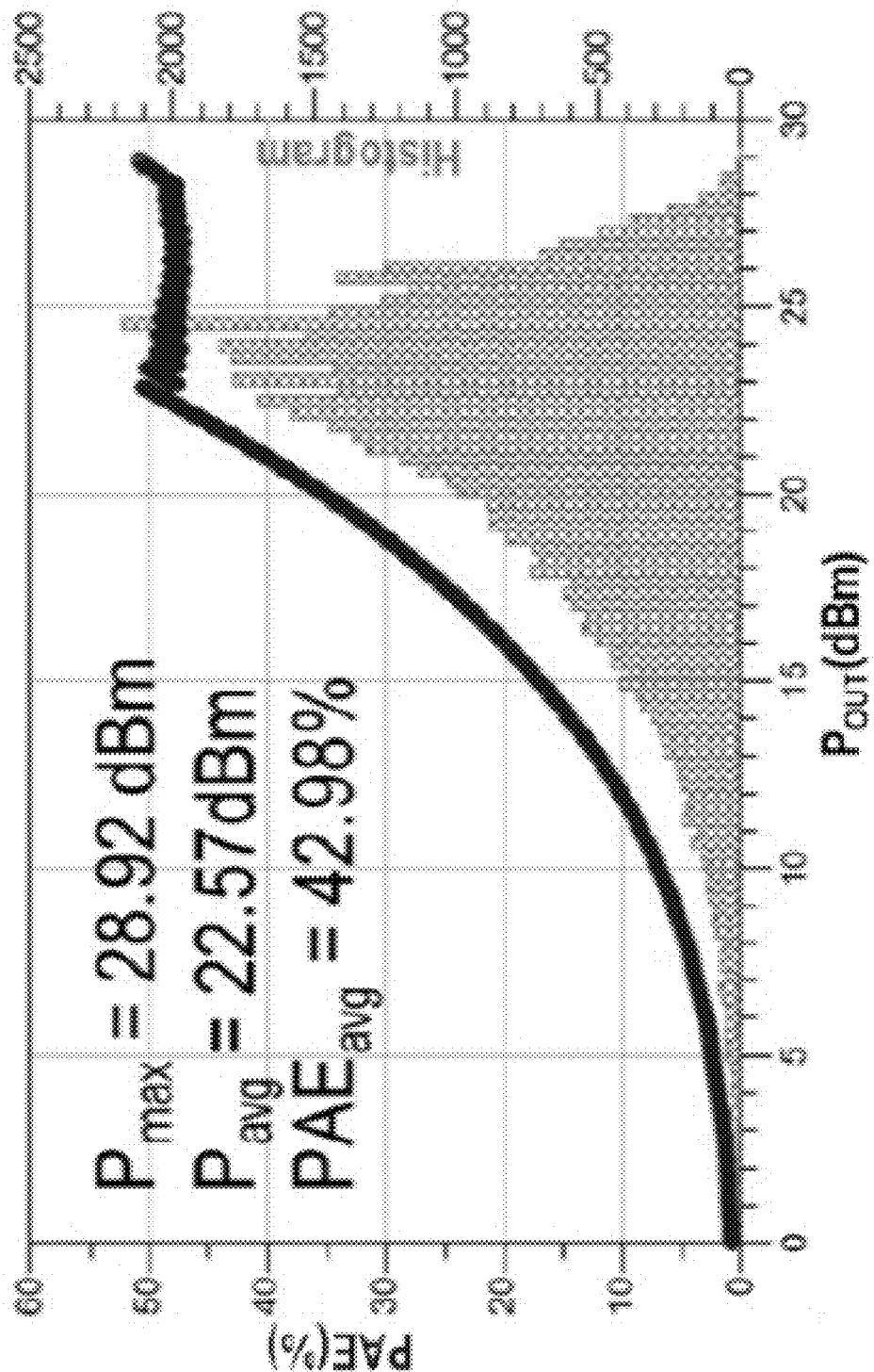
FIG. 12 is a chart depicting the simulated output power and efficiency of a mixed-signal Doherty PA operating at 5 GHz, according to an example embodiment.

The graph in FIG. 11A shows the power gain vs. the input power as the digitally controlled analog branches are sequentially turned on by the system. FIG. 11B is a zoomed-in version of the graph from FIG. 11A that shows that the synthesized gain staircase is less than 0.1 dB, demonstrating that the sequential operation of the digitally controlled analog branches substantially increases the linearity of the PA. The graph is FIG. 12 shows the instantaneous power added efficiency (PAE) vs. the output power. FIG. 12 shows that the system can achieve 43% average PAE and maintain a high efficiency in the power back off region due to the sequential operation of the digitally controlled analog branches.

Figure 13A:
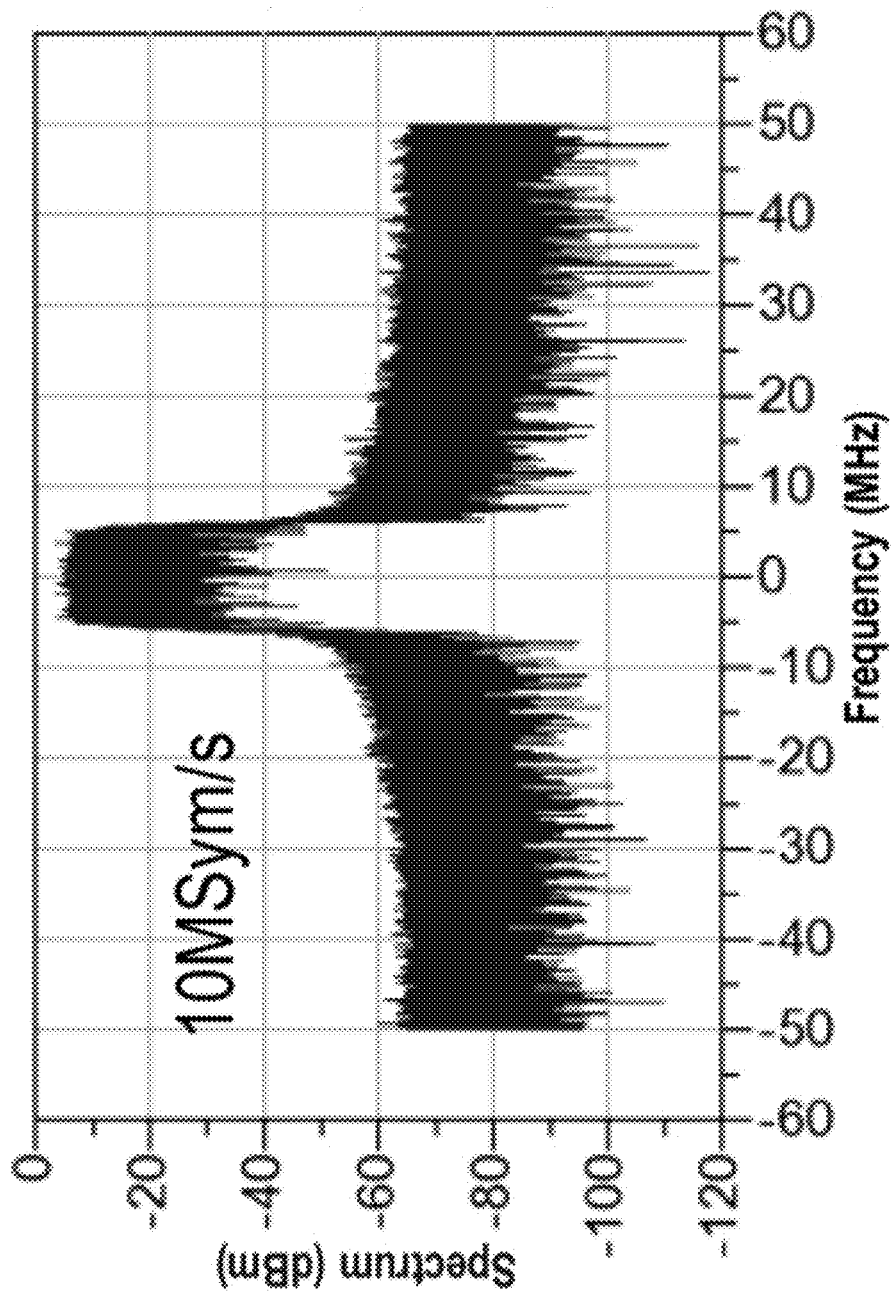
FIGS. 13A-C are charts depicting the simulated output spectrum of a mixed-signal Doherty PA operating at 5 GHz, according to an example embodiment.
Figure 13B:
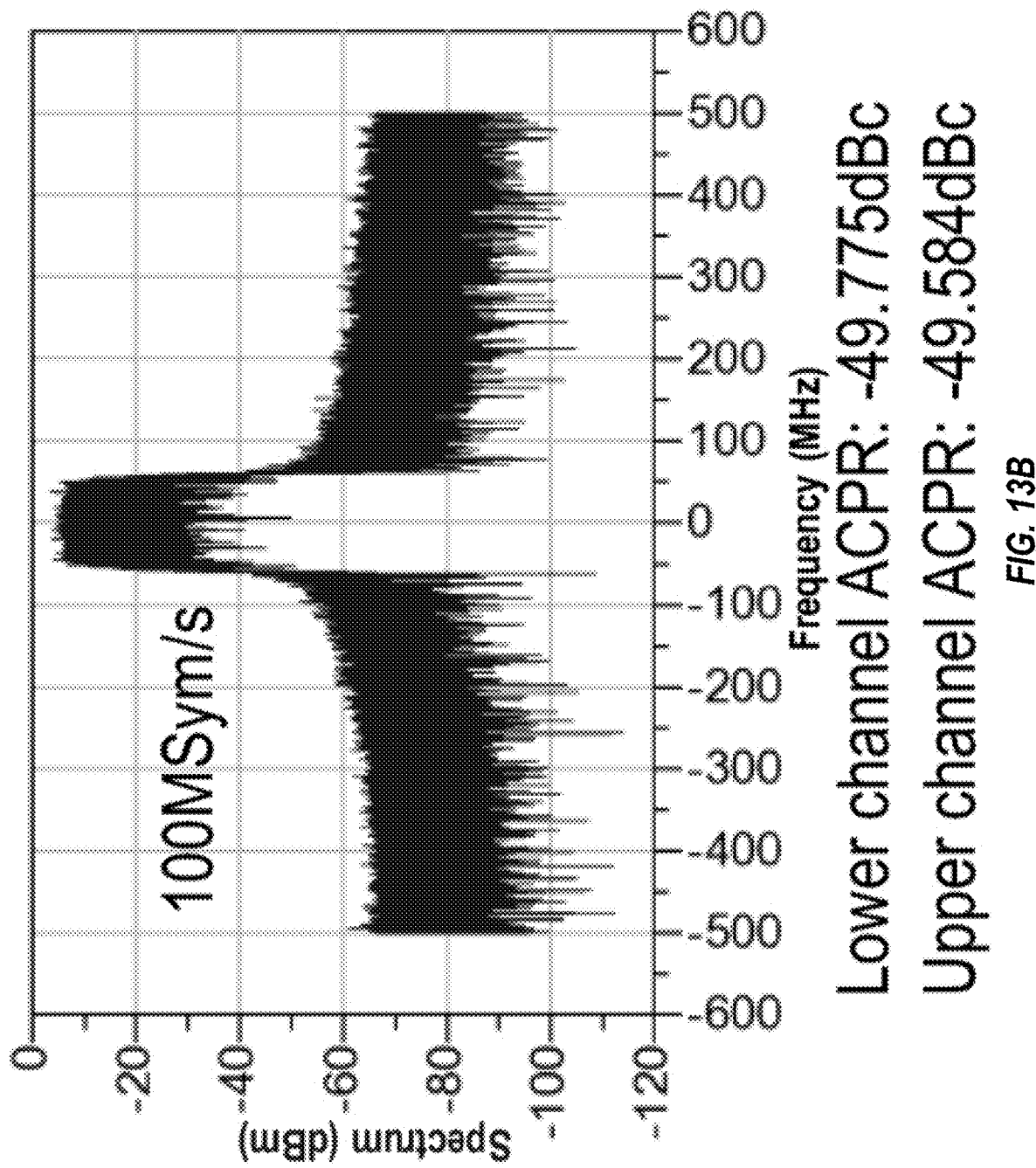
Figure 13C:
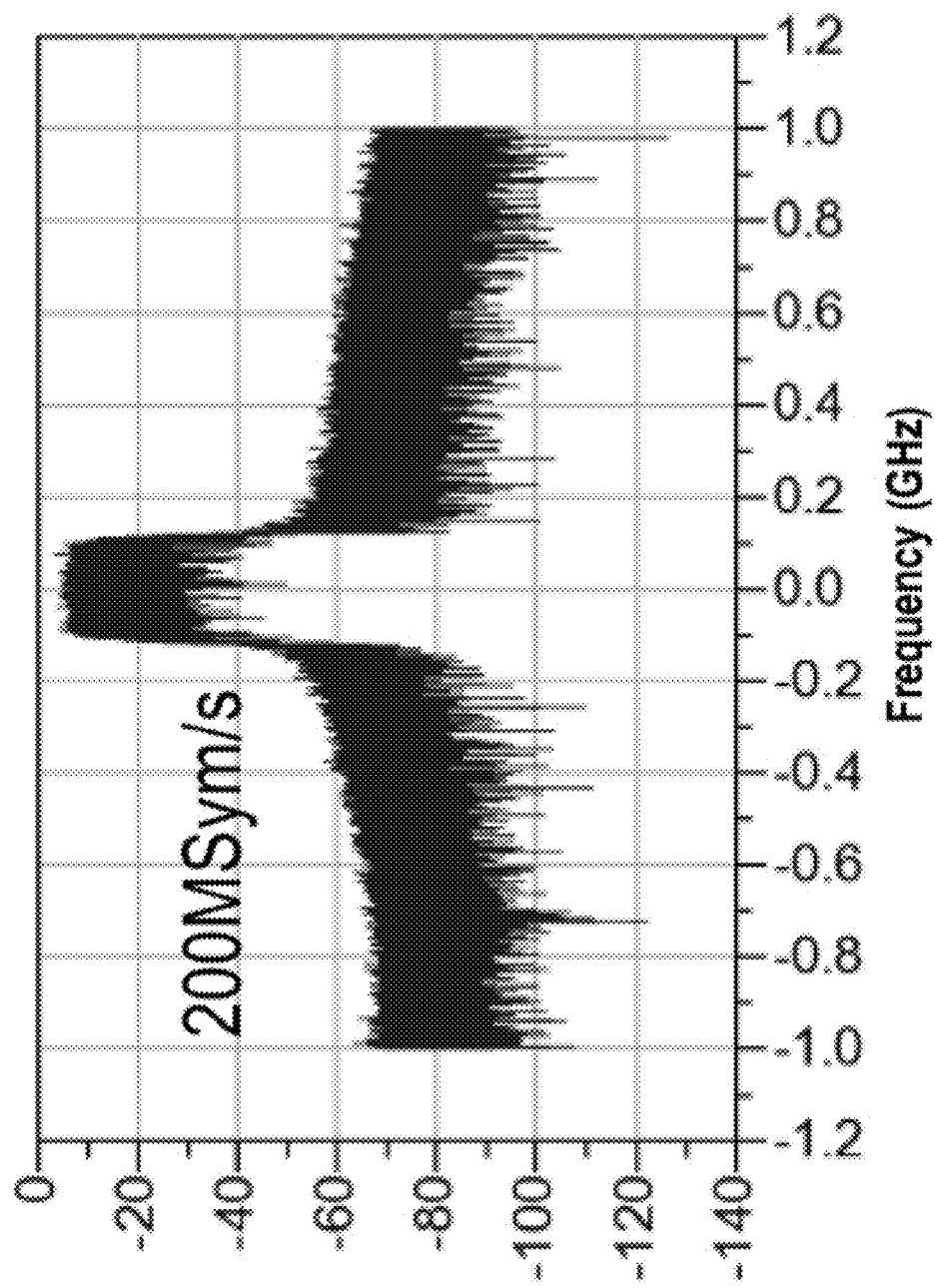
Figure 14A:
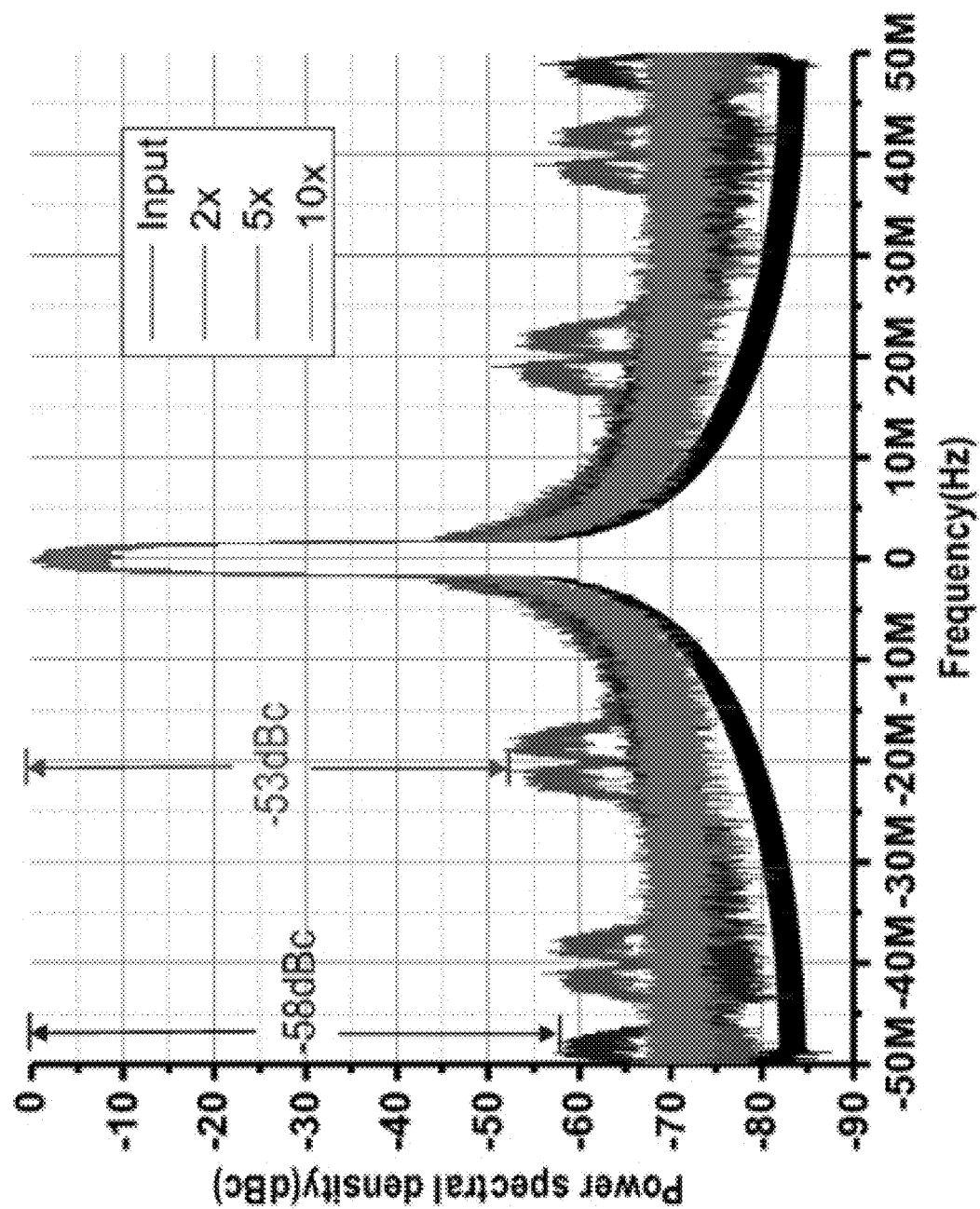
FIGS. 14A-B are charts depicting the simulated power spectral density versus frequency of a mixed-signal Doherty PA operating at 5 GHz, according to an example embodiment.
Figure 14B:
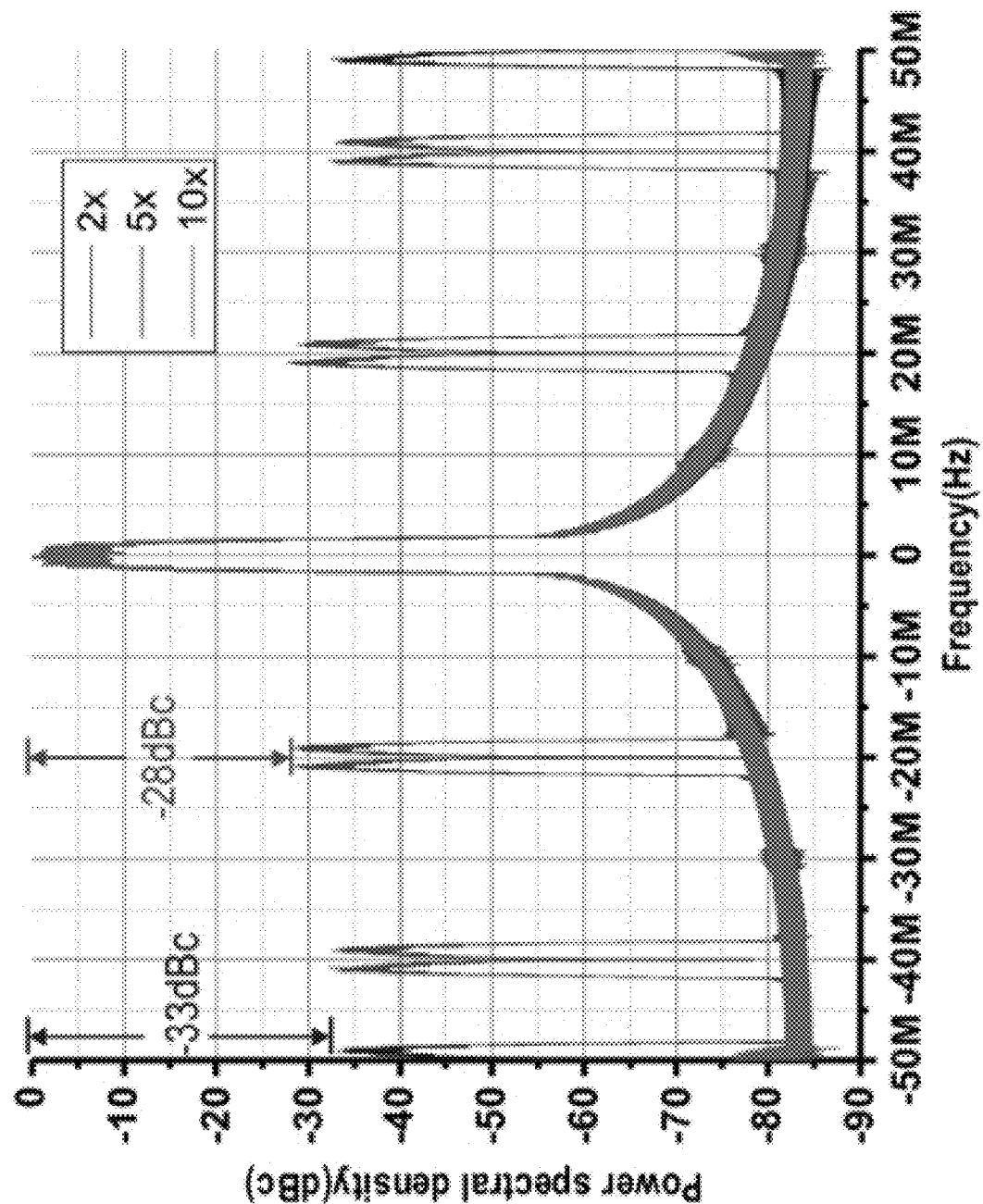

The graphs in FIG. 13A, FIG. 13B, and FIG. 13C show the output spectrum vs. the frequency. FIG. 13A, FIG. 13B, and FIG. 13C show that the system can consistently achieve better than −49 dBc ACLR at 10M/100M/200 MSym/s 64QAM modulation signal. The graphs in FIG. 14A and FIG. 14B show the power spectral density vs. the frequency. FIG. 14A shows that the results of a simulation of a mixed-signal Doherty PA output spectra while amplifying a complex modulated signal with different oversampling ratio, while FIG. 14B shows the results of a simulation of an oversampled complex modulated signal. The sampling images in the complex modulated signal were suppressed by 25 dB from the envelope signal demonstrating that sampling images are substantially suppressed due to this mixed-signal Doherty operation, compared with conventional digital PA.

Another example architecture similar to that shown in FIG. 1 served as a test system comprising a mixed-signal Doherty PA architecture having a main path comprising one analog branch and a single auxiliary path. In one embodiment, the auxiliary path comprises 3 bits or 8 binary-weighted ritually controlled branches, and in another embodiment the auxiliary path comprises 4 bits or 16 binary-weighted digitally controlled branches. Simulations were performed on both embodiments of this architecture at 28 GHz operation using a real transistor in a GF45 nm CMOS SOI process and an ideal lossless Doherty network. FIG. 15A-FIG. 20B show the results of the simulations of two embodiments of the example architecture.

Figure 15A:
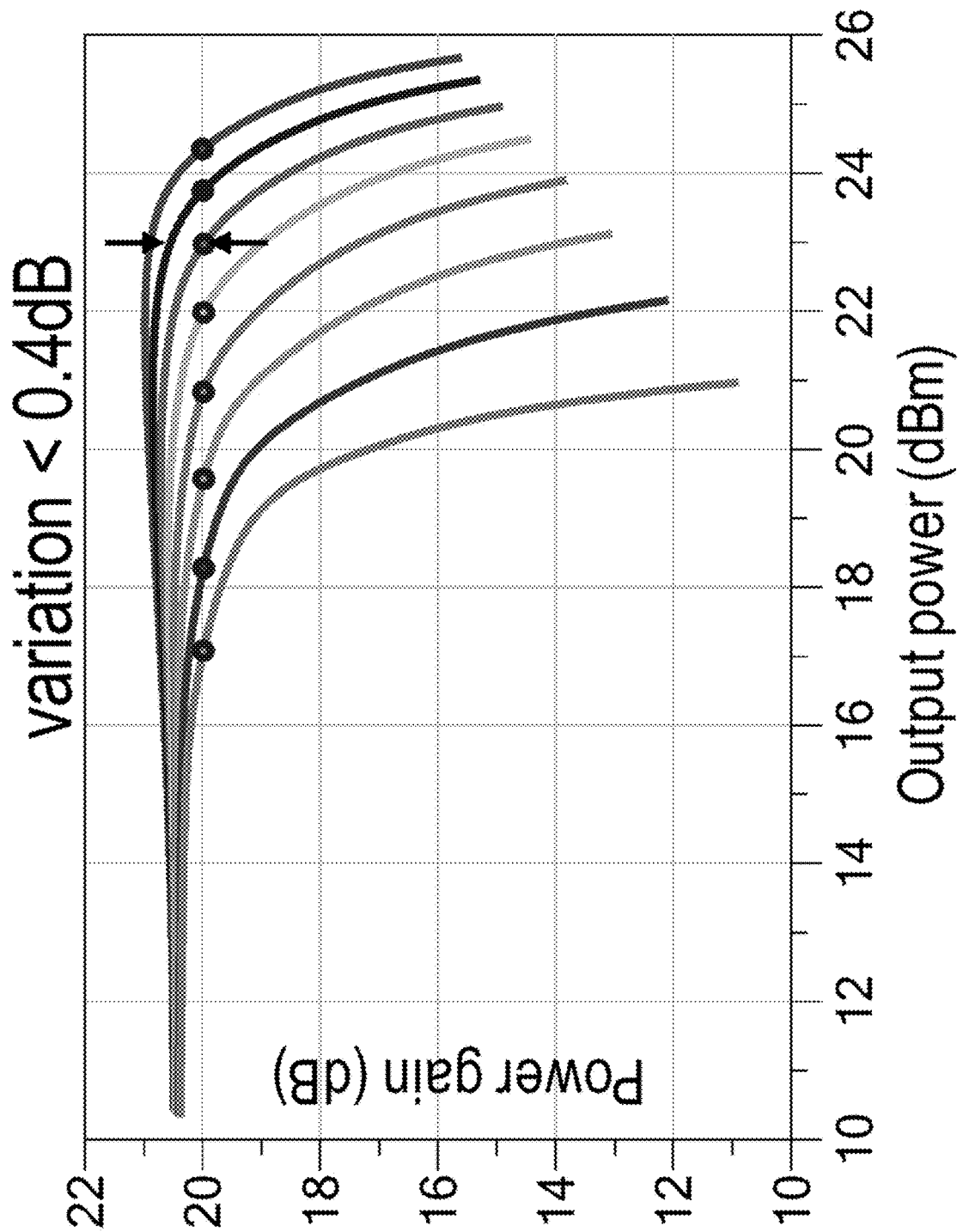
FIGS. 15A-B are charts depicting the simulated power gain of a mixed-signal Doherty PA operating at 28 GHz, according to an example embodiment.
Figure 15B:
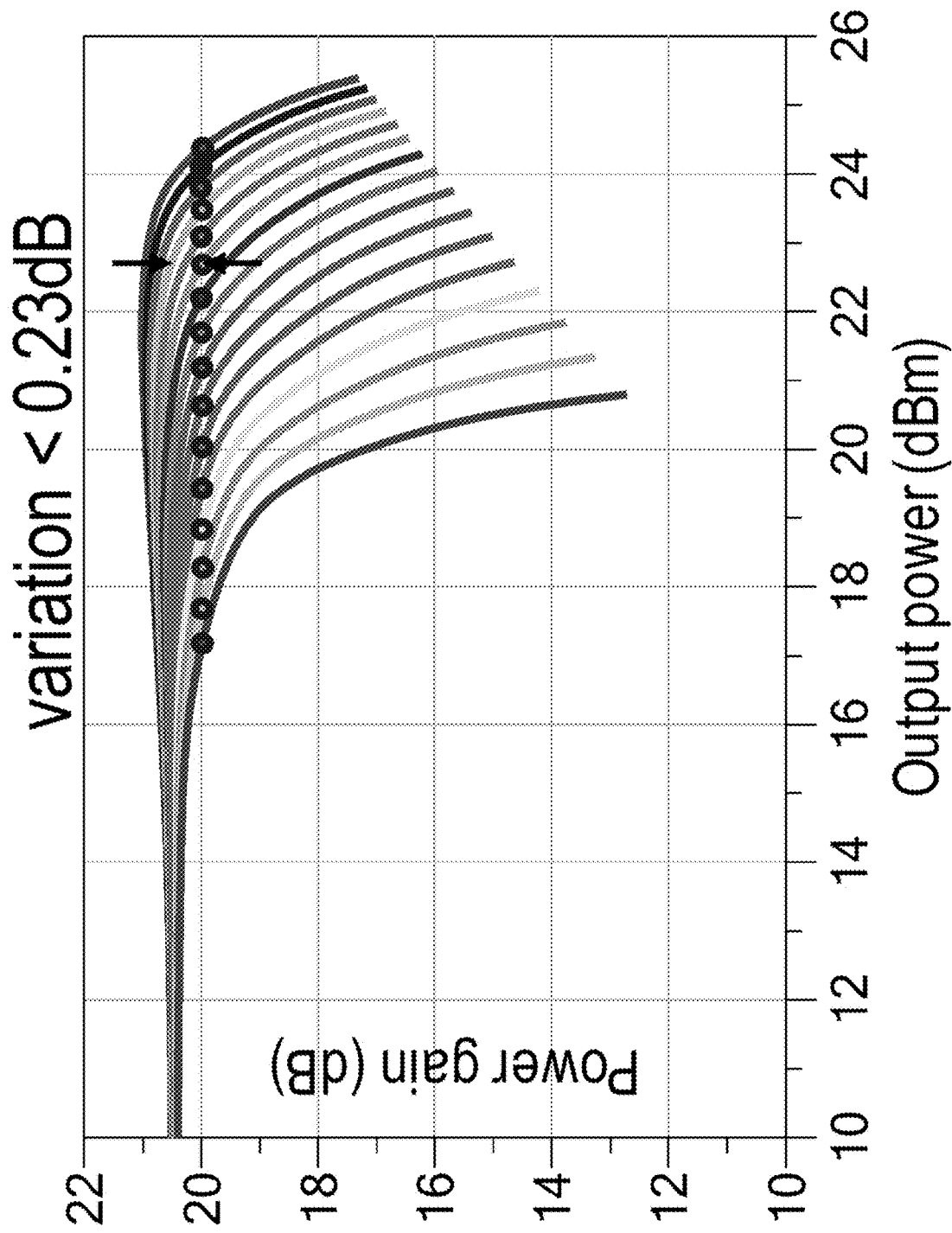
Figure 16A:
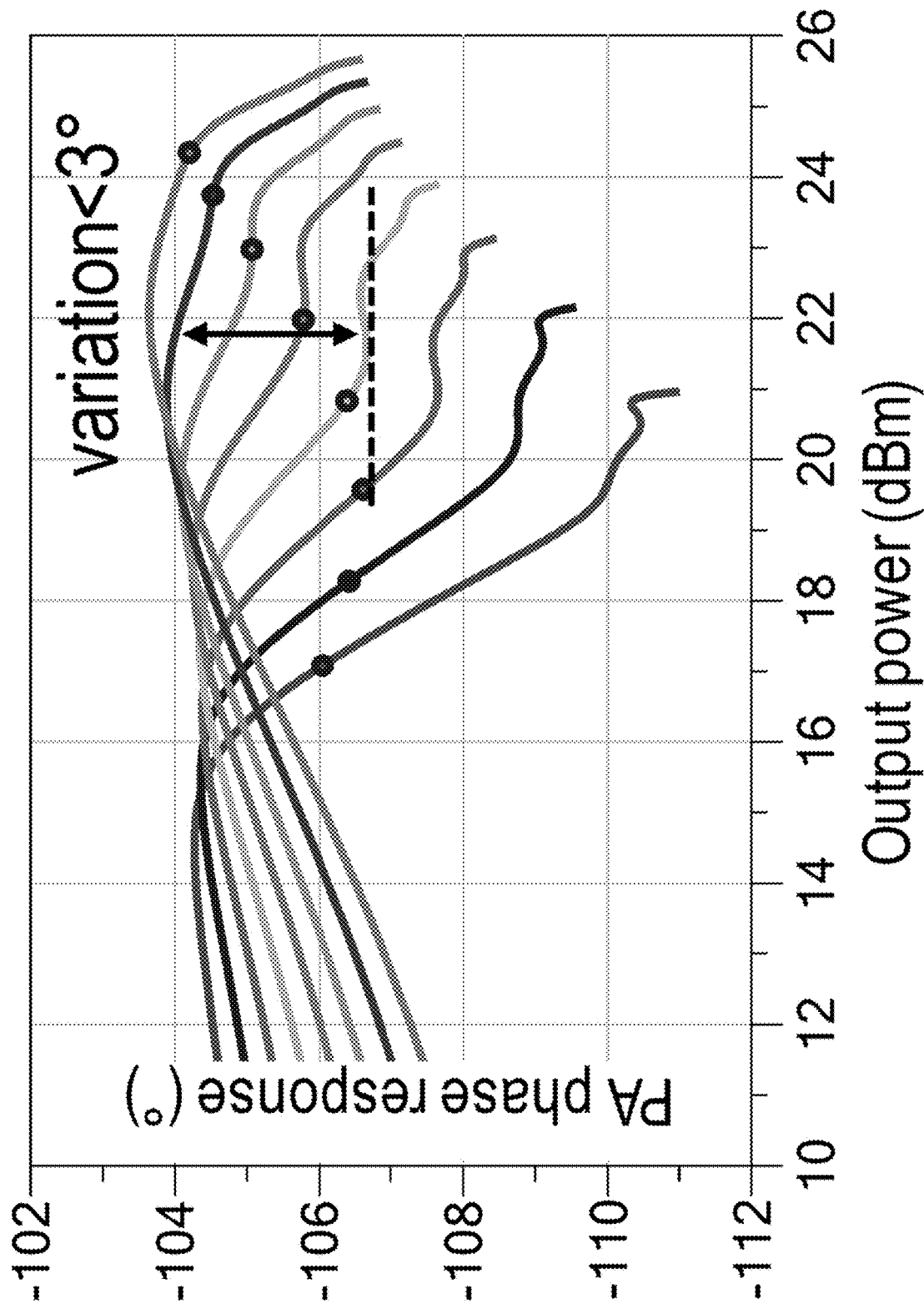
FIGS. 16A-B are charts depicting the simulated output phase response of a mixed-signal Doherty PA operating at 28 GHz, according to an example embodiment.
Figure 16B:
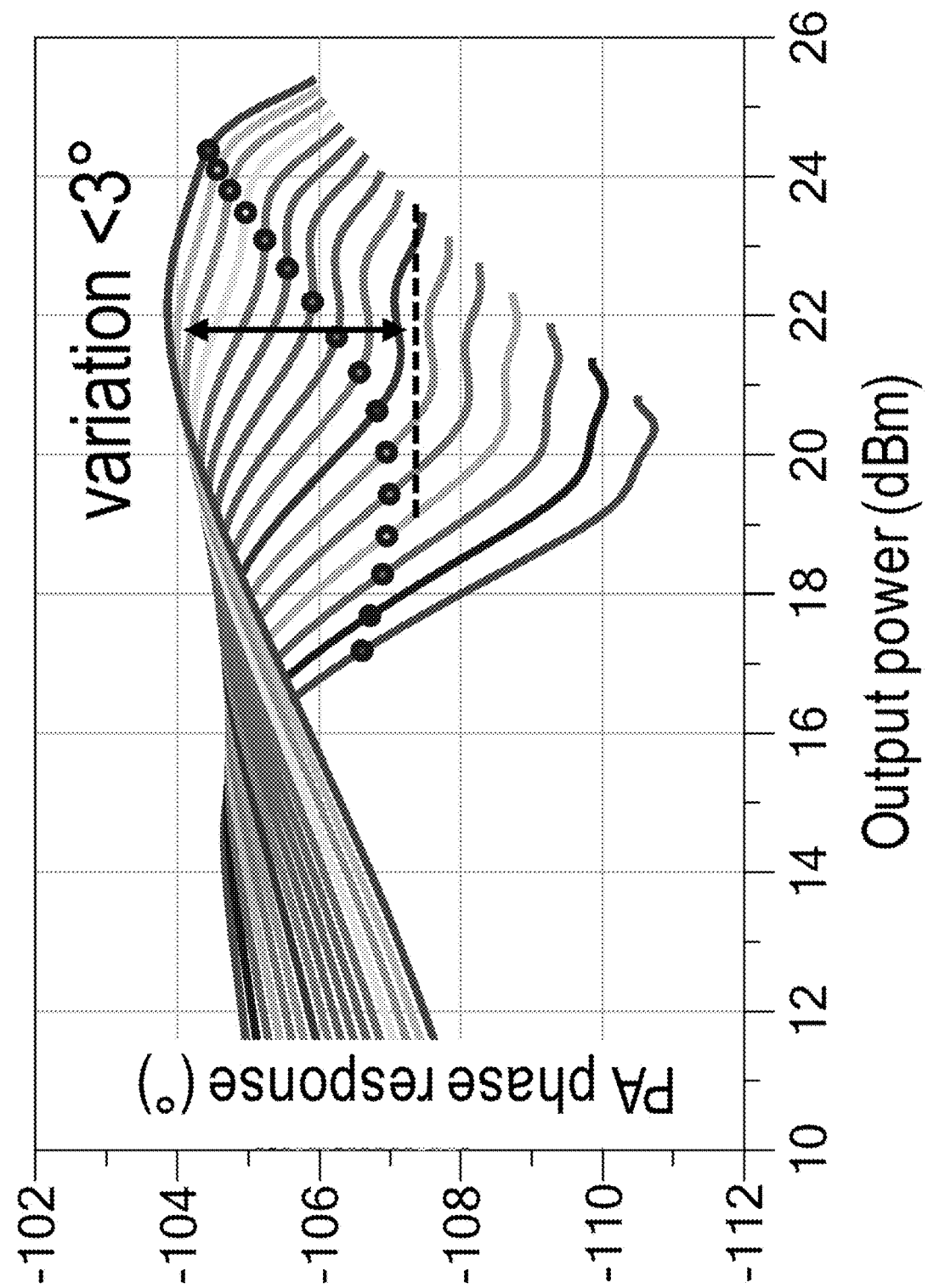

The graphs in FIGS. 15A and 15B show the power gain vs. the input power as the digitally controlled analog branches are sequentially turned on by the system. The graphs shows that the synthesized gain staircase for the 3 bit case is less than 0.4 dB and the 4 bit case is less than 0.23 dB, demonstrating that the sequential operation of the digitally controlled analog branches substantially increases the linearity of the PA for both the 3 bit and 4 bit cases. The graphs in FIG. 16A and FIG. 16B show the phase response vs. the output power. FIG. 16A and FIG. 16B show that they system can achieve phase variation of less than 3° for both the 3 bit and 4 bit cases, demonstrating that the mixed signal operation of the PA further improves linearity in the system.

Figure 17A:
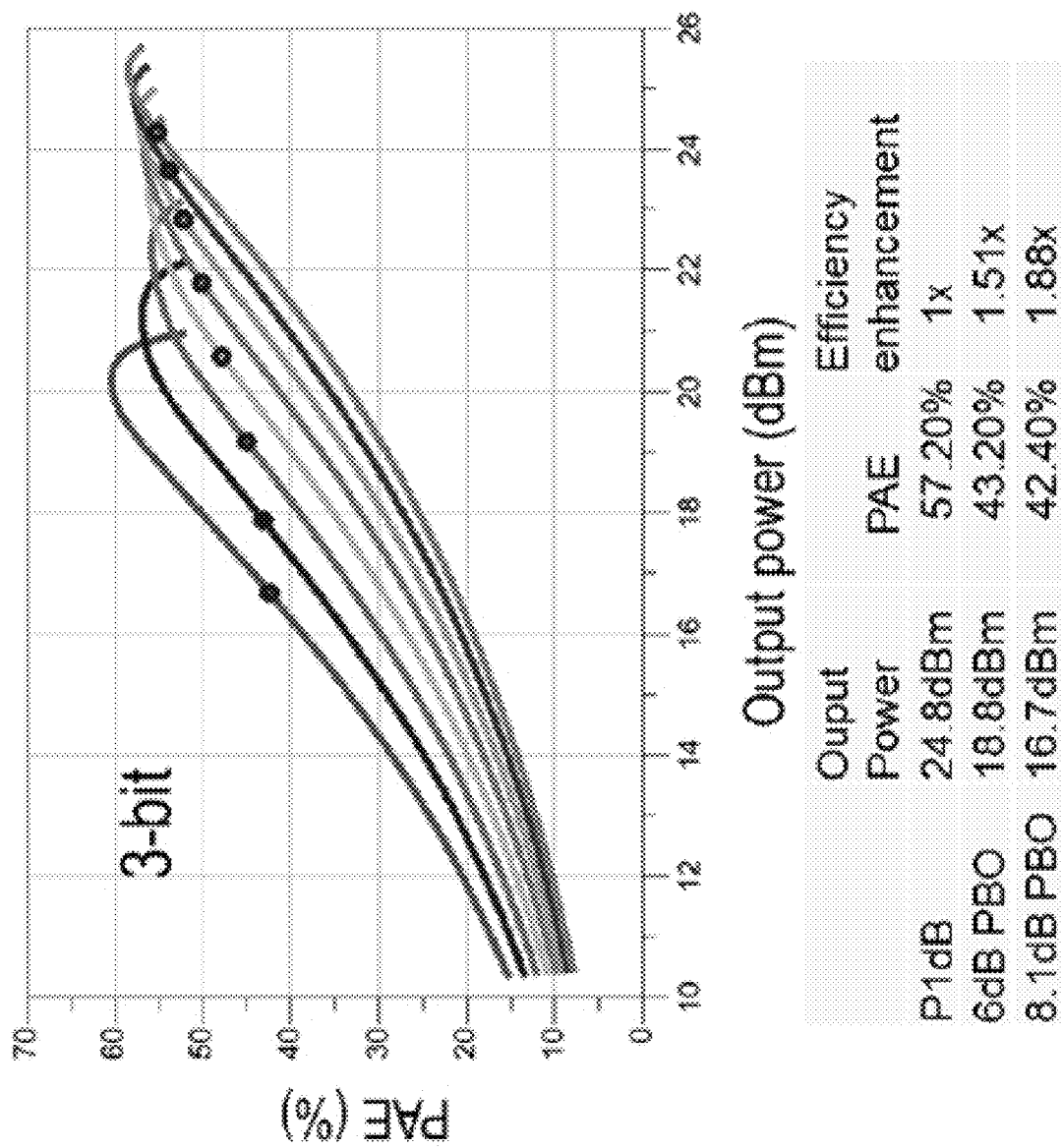
FIGS. 17A-B are charts depicting the simulated power efficiency enhancement during back-off of a mixed-signal Doherty PA operating at 28 GHz, according to an example embodiment.
Figure 17B:
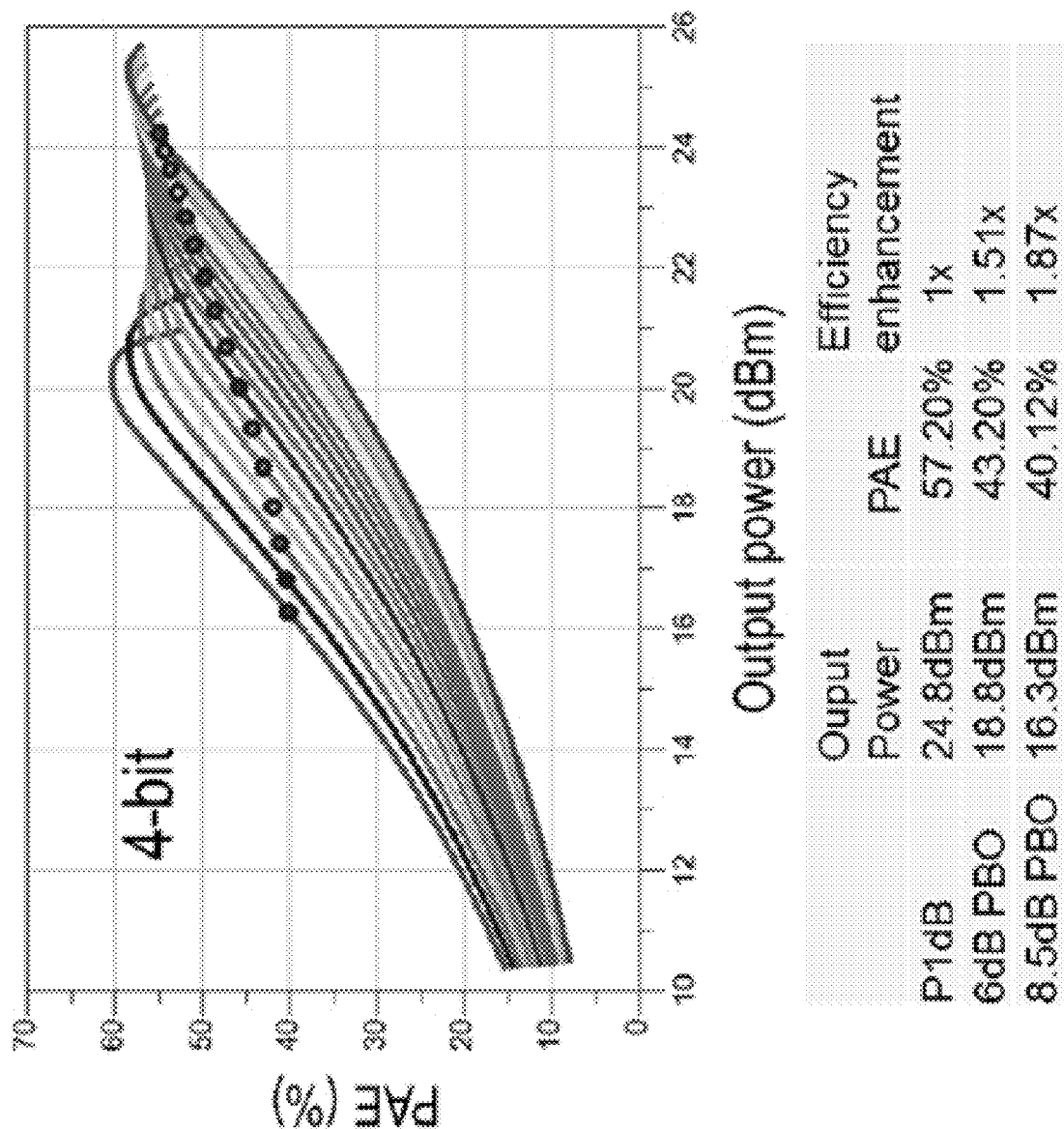
Figure 18A:
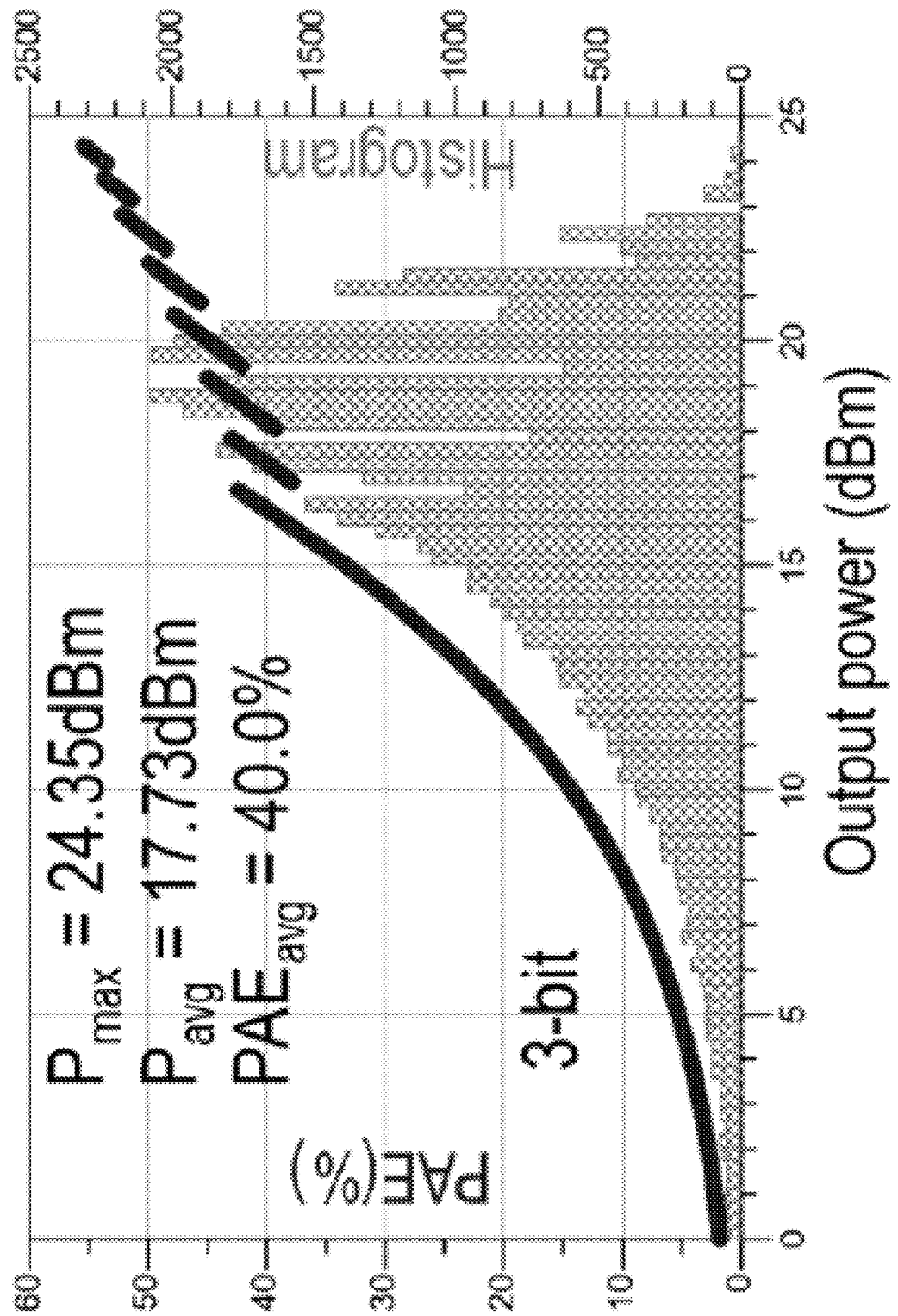
FIGS. 18A-B are charts depicting the simulated output power and efficiency of a mixed-signal Doherty PA operating at 28 GHz, according to an example embodiment.
Figure 18B:
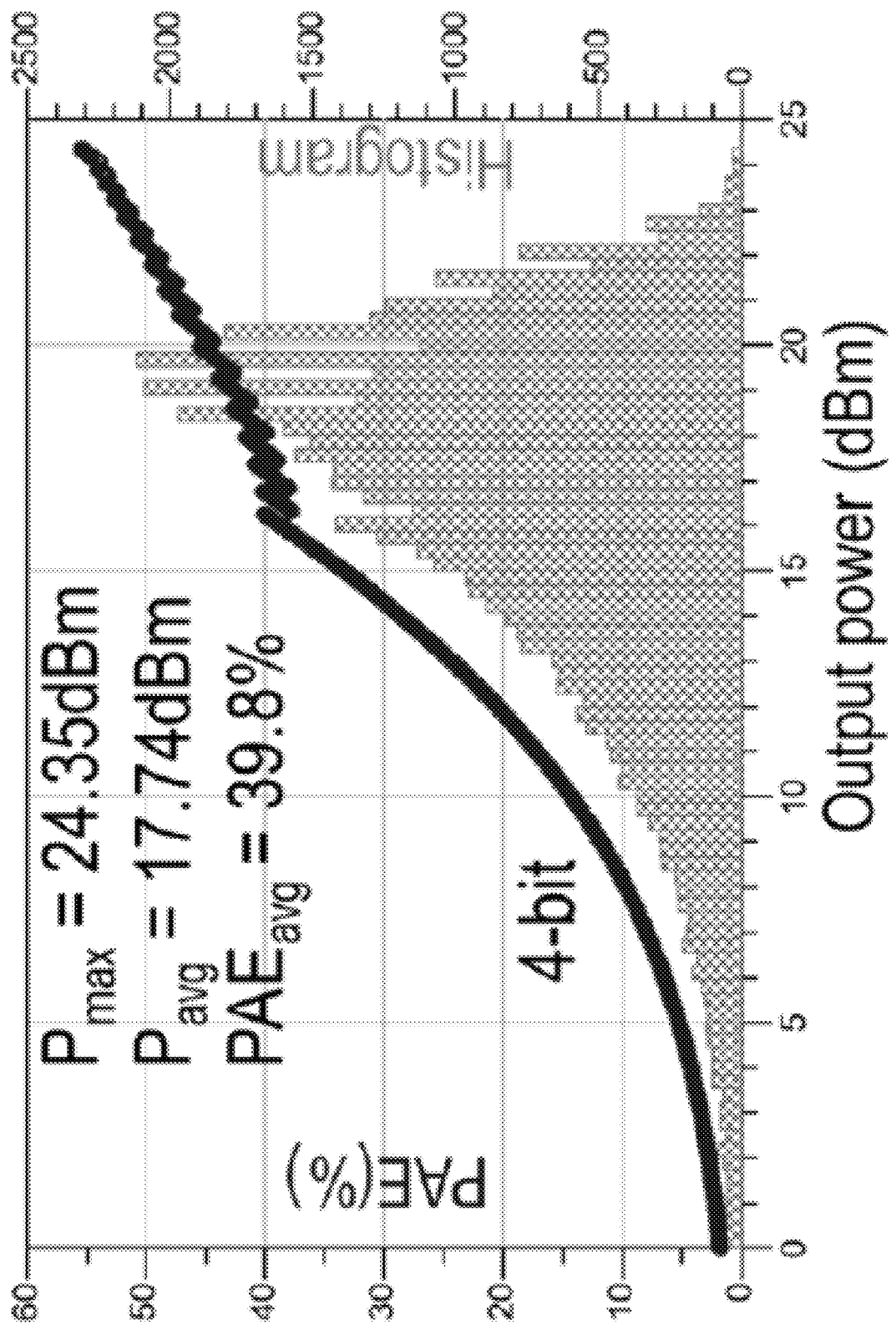

The graphs in FIG. 17A and FIG. 17B show the PAE during back-off vs. the output power. FIG. 17A and FIG. 17B show that the system can achieve 57.2% PAE at 24.8 dBm for both the 3 bit and 4 bit cases demonstrating that the sequential operation of the digitally controlled analog branches improves power efficiency during power back-off. The graphs is FIG. 18A and FIG. 18B show the instantaneous PAE vs. the output power. FIG. 18A and FIG. 18B show that the system can achieve 40% average PAE for the 3 bit case and 39.8% average PAE and maintain a high efficiency in the power back off region in both cases due to the sequential operation of the digitally controlled analog branches.

Figure 19A:
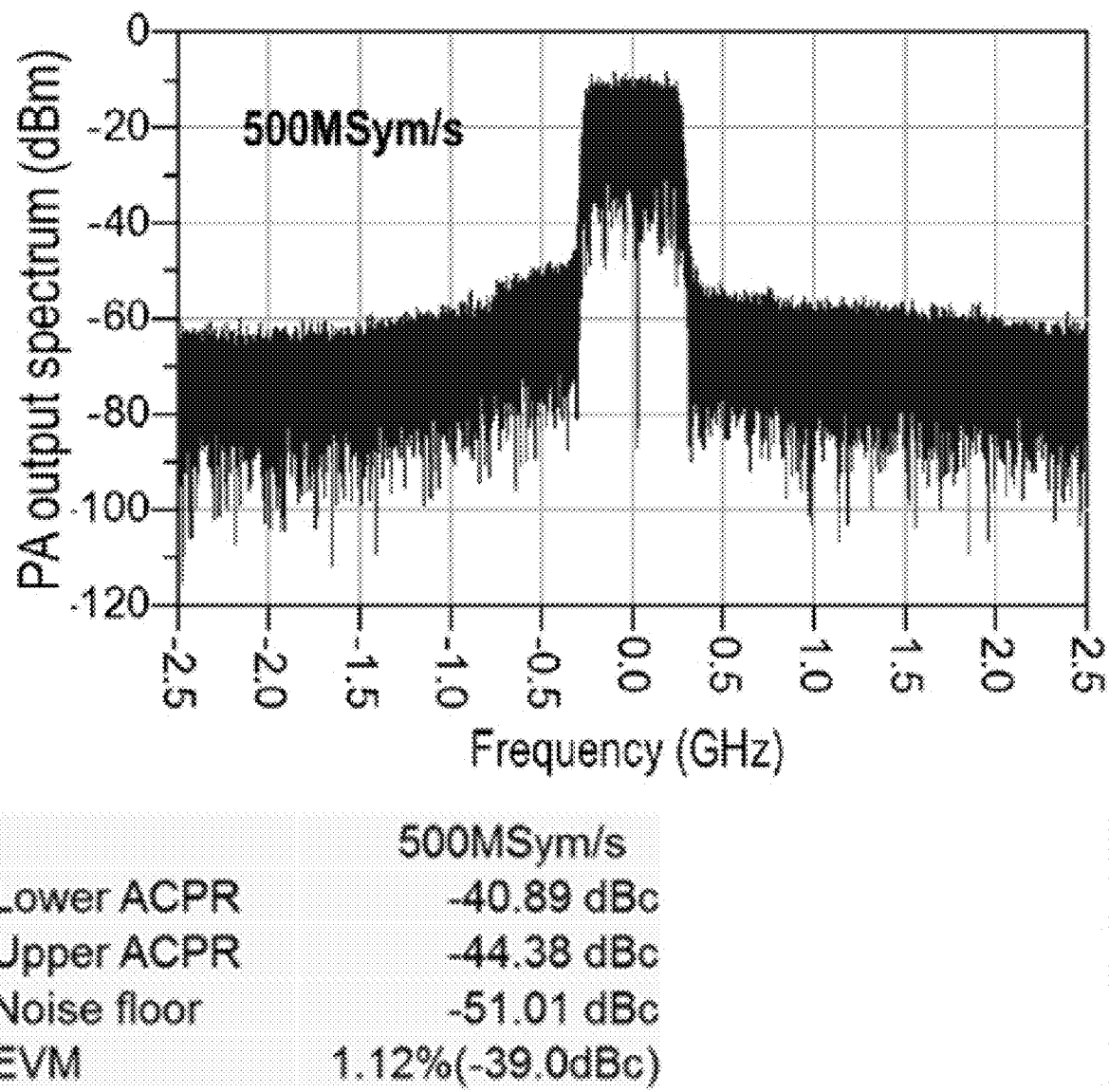
FIGS. 19A-B are charts depicting the simulated output spectrum of a mixed-signal Doherty PA operating at 28 GHz, according to an example embodiment.
Figure 19B:
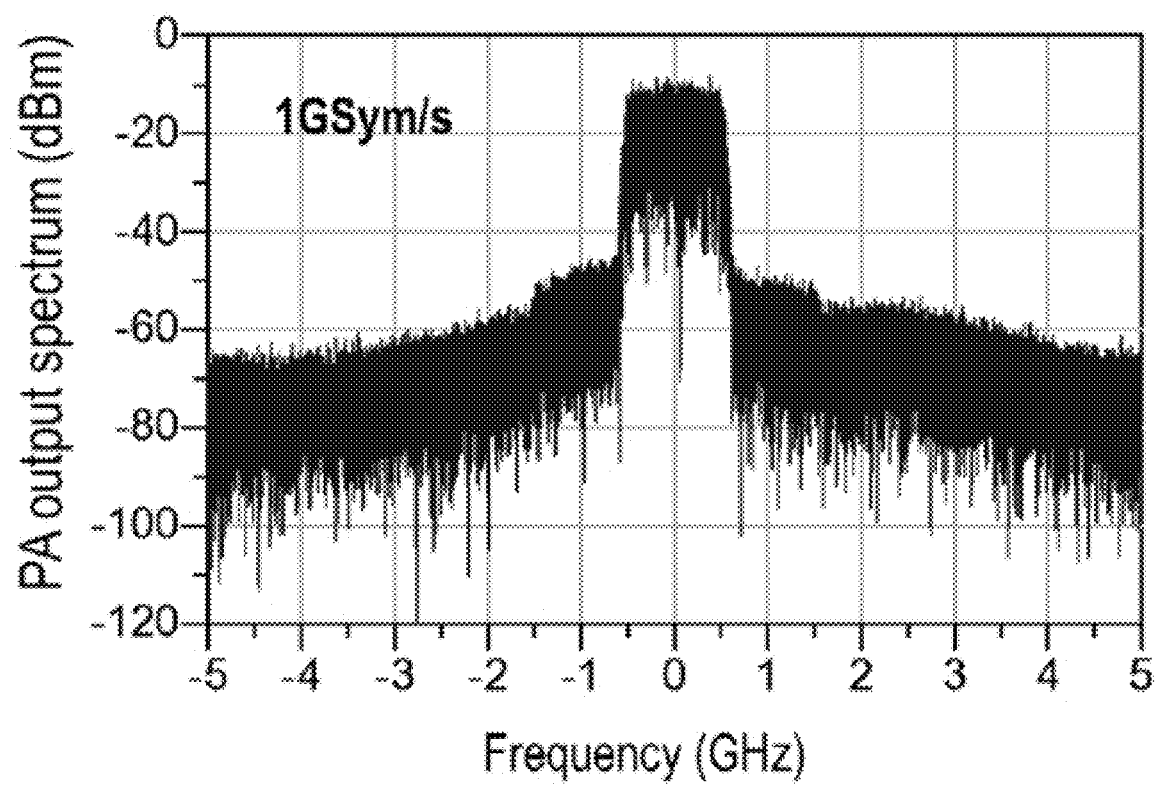
Figure 20A:
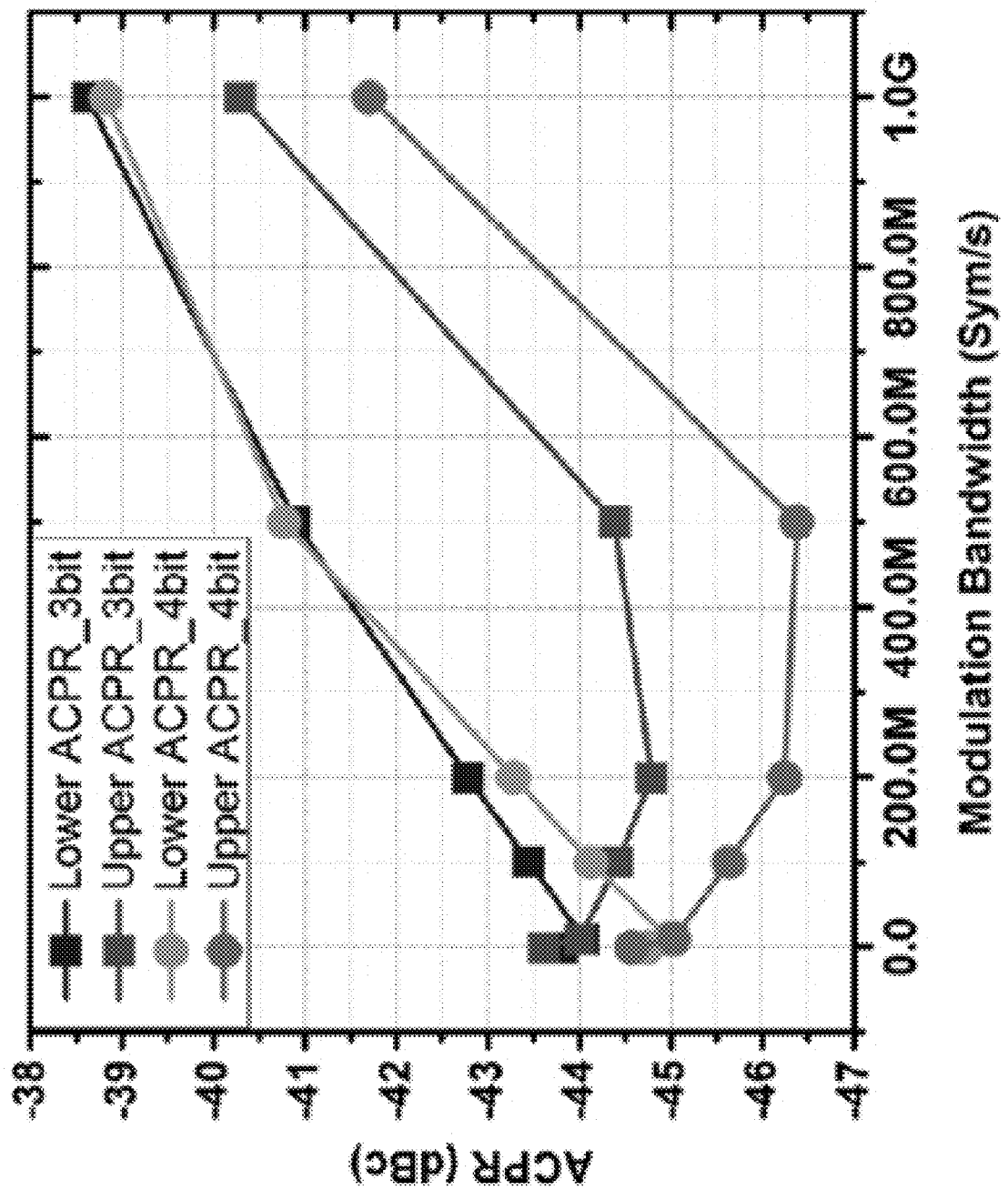
FIGS. 20A-B are charts depicting the simulated ACPR, EVM, and noise floor versus modulation bandwidth of a mixed-signal Doherty PA operating at 28 GHz, according to an example embodiment.
Figure 20B:
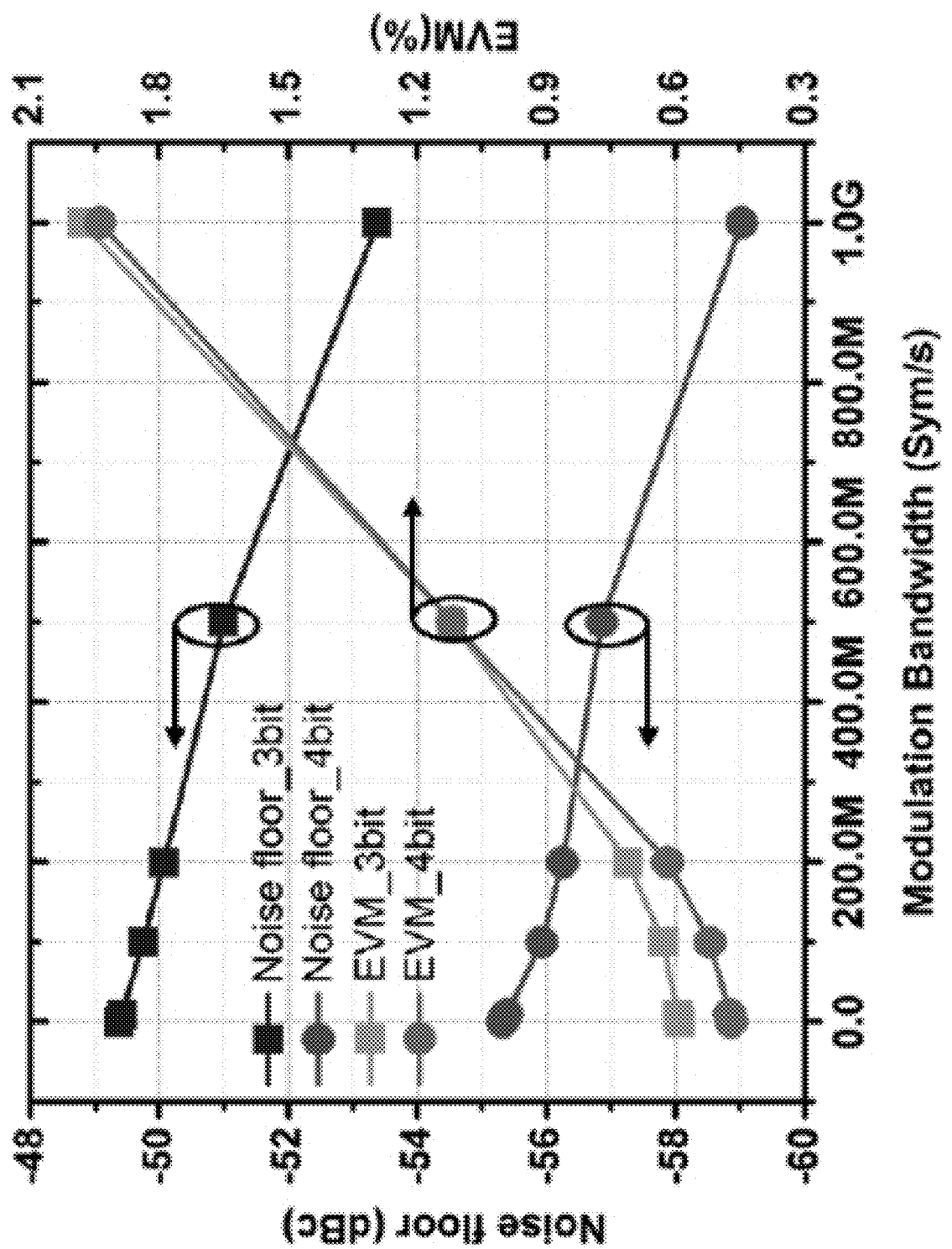

The graphs in FIG. 19A and FIG. 19B show the output spectrum vs. the frequency. FIG. 19A and FIG. 19B show that the system can achieve can achieve −40.89 dBc ACLR at 500 MSym/s 64QAM modulation signal and −38.62 dBc ACLR at 1 GSym/s 64QAM modulation signal. The graph in FIG. 20A shows adjacent channel power ration (ACPR) vs. modulation bandwith, while the graph in FIG. 20B shows noise floor vs. modulation bandwidth. FIG. 20A shows that the system can achieve better than −38 dBc ACLR at up to 1 GSym/s 64QAM modulation signal. FIG. 20B shows that the system can achieve better than 2% EVM and better than −49 dBc noise floor at up to 1 GSym/s 64QAM modulation signal. The combination of FIG. 20A and FIG. 20B demonstrate that the mixed signal operation of the system can support large modulation bandwidth without significant memory effects.

Figure 21:
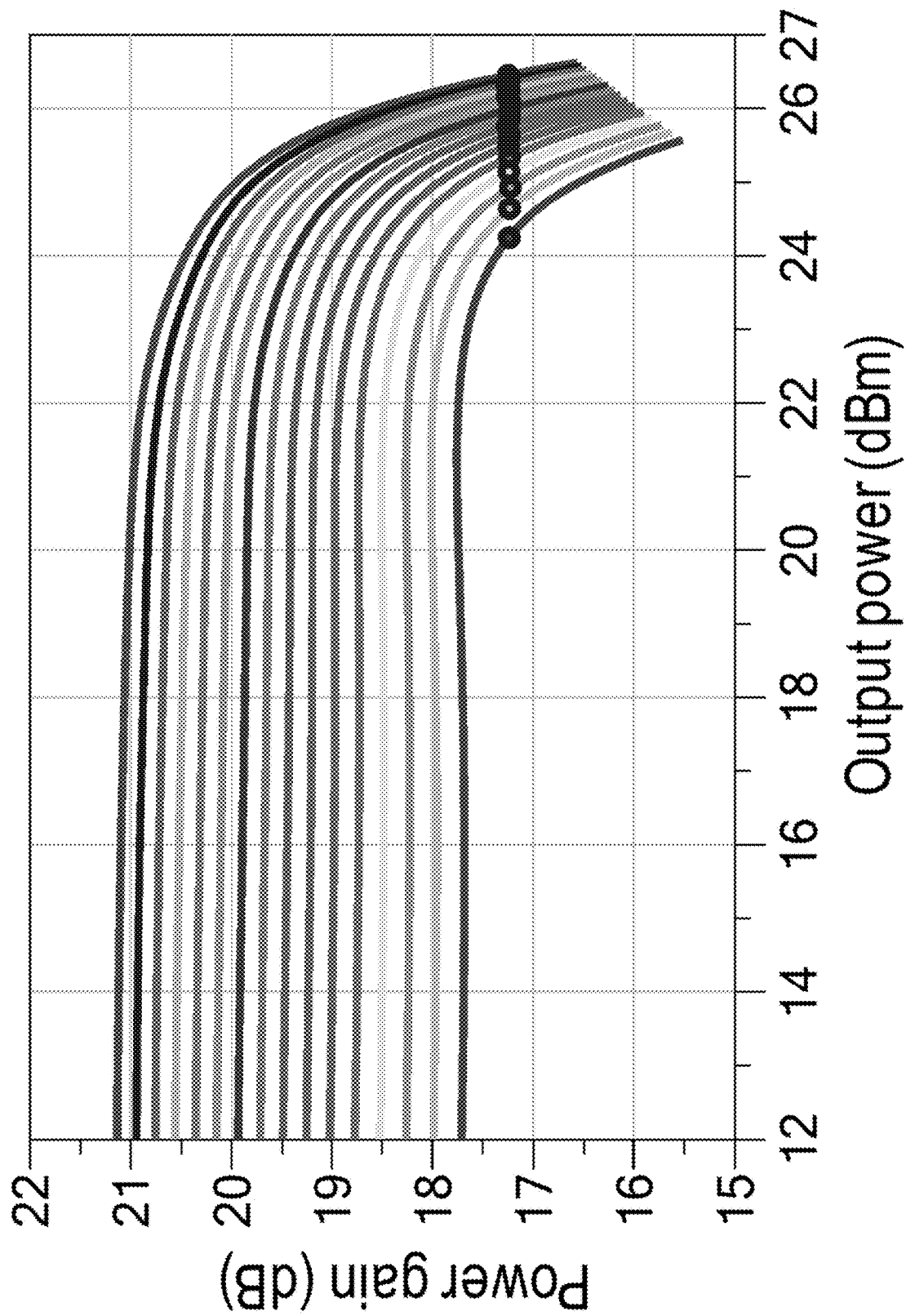
FIG. 21 is a chart depicting the simulated power gain of a mixed-signal single-path Doherty PA operating at 5 GHz, according to an example embodiment.
Figure 22:
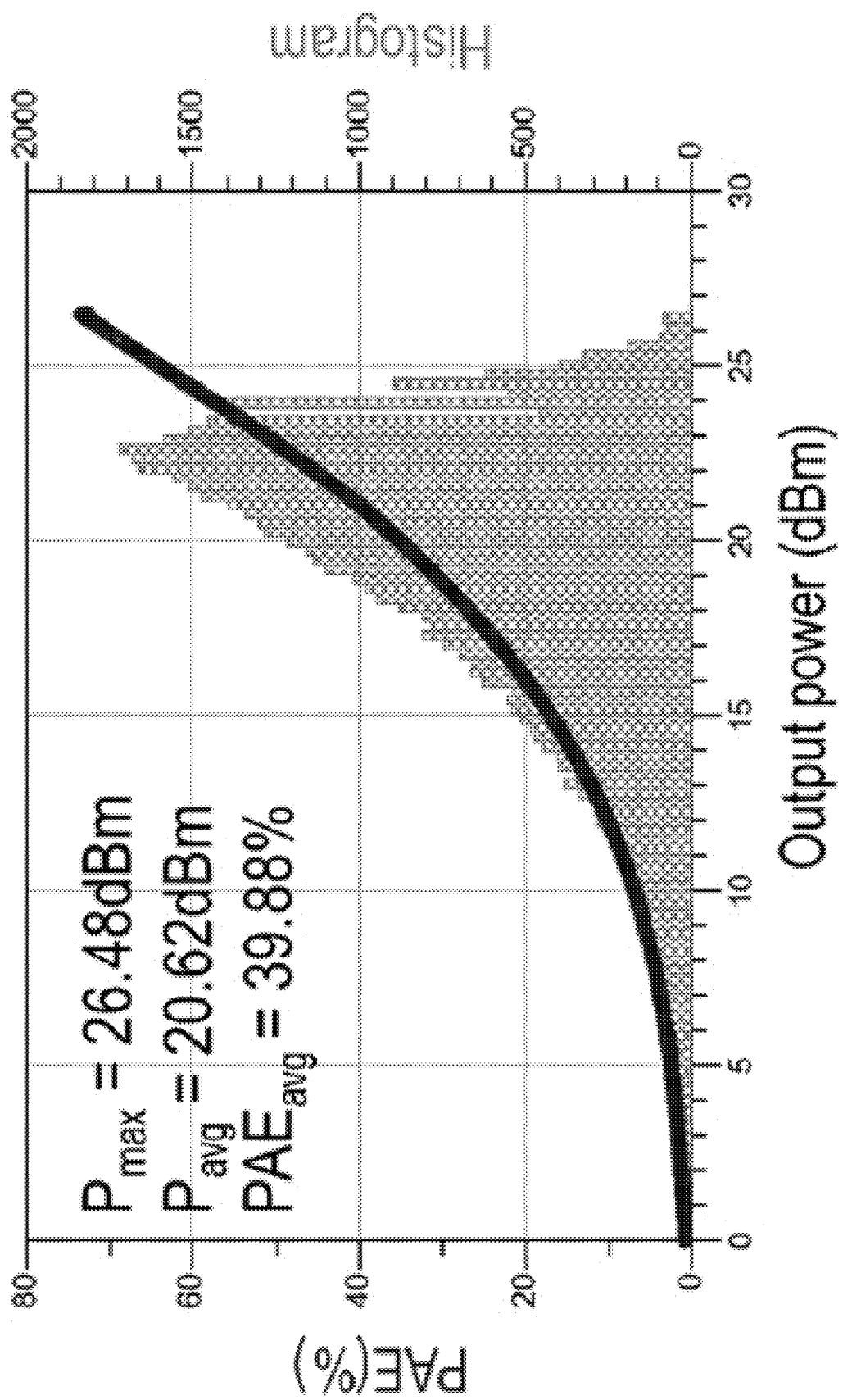
FIG. 22 is a chart depicting the simulated output power and efficiency of a mixed-signal single-path Doherty PA operating at 5 GHz, according to an example embodiment.
Figure 23:
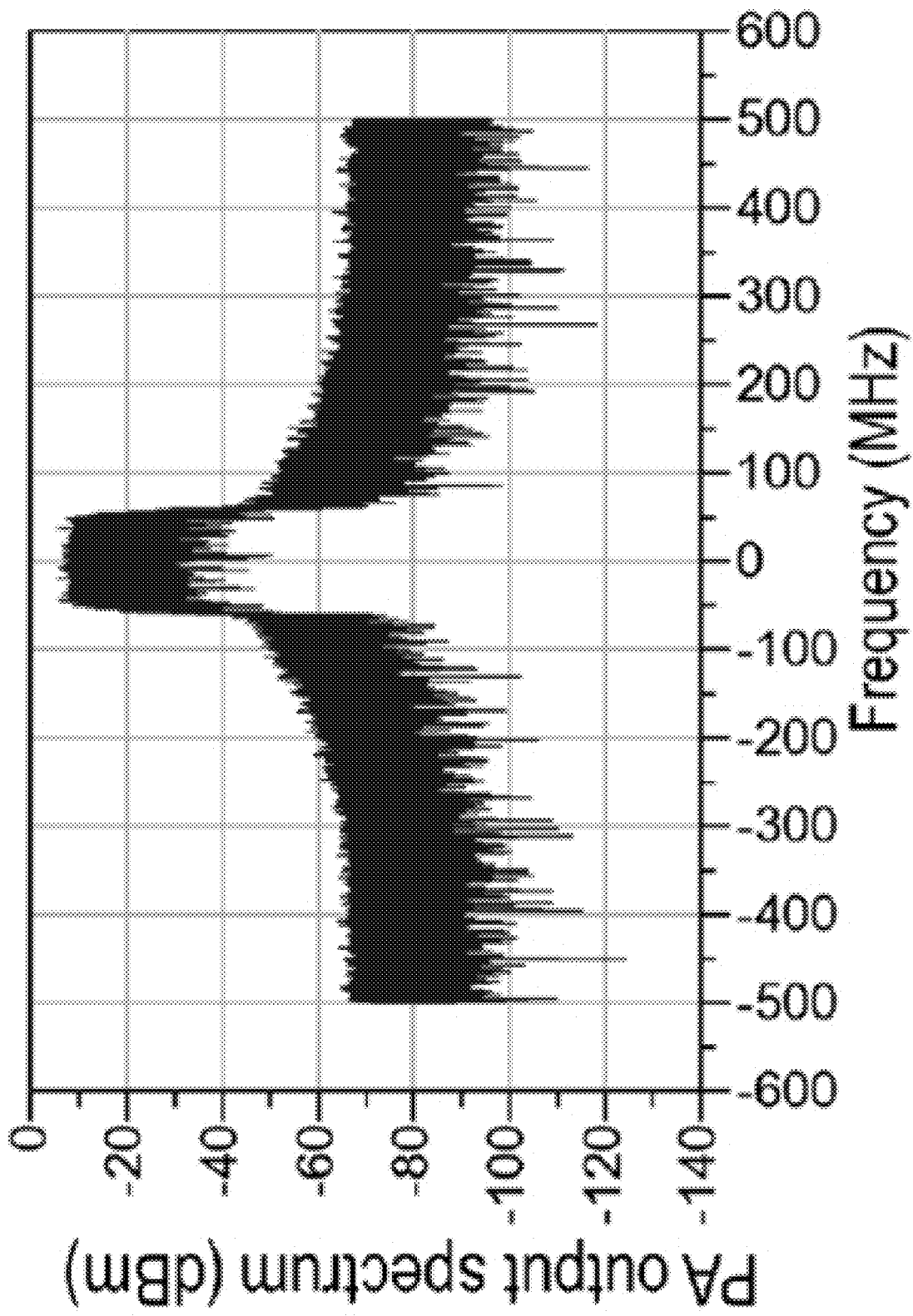
FIG. 23 is a chart depicting the simulated output spectrum of a mixed-signal single-path Doherty PA operating at 5 GHz, according to an example embodiment.

An additional example architecture similar to that shown in FIG. 1 served as a test system comprising a mixed-signal Doherty PA architecture having a main path comprising one analog branch and a single auxiliary path comprising 4 bits or 16 binary-weighted digitally controlled branches. Simulations were performed on this system at 5 GHz operation using a real transistor in a GF45 nm CMOS SOI process and an ideal lossless Doherty network. FIG. 21-FIG. 23 show the results of the simulations of the example architecture.

The graph in FIG. 21 show the power gain vs. the input power as the digitally controlled analog branches are sequentially turned on by the system. The graph show that the synthesized gain staircase is less than 0.26 dB, demonstrating that the sequential operation of the digitally controlled analog branches substantially increases the linearity of the PA. The graph in FIG. 22 shows the instantaneous PAE vs. the output power. FIG. 22 shows that the system can achieve 39.88% average PAE and maintain a high efficiency in the power back off region due to the sequential operation of the digitally controlled analog branches. The graph in FIG. 23 shows the output spectrum vs. the frequency. FIG. 23 shows that the system can achieve −44.4 dBc ACLR at 100 MSym/s 64QAM modulation signal.

Figure 24:
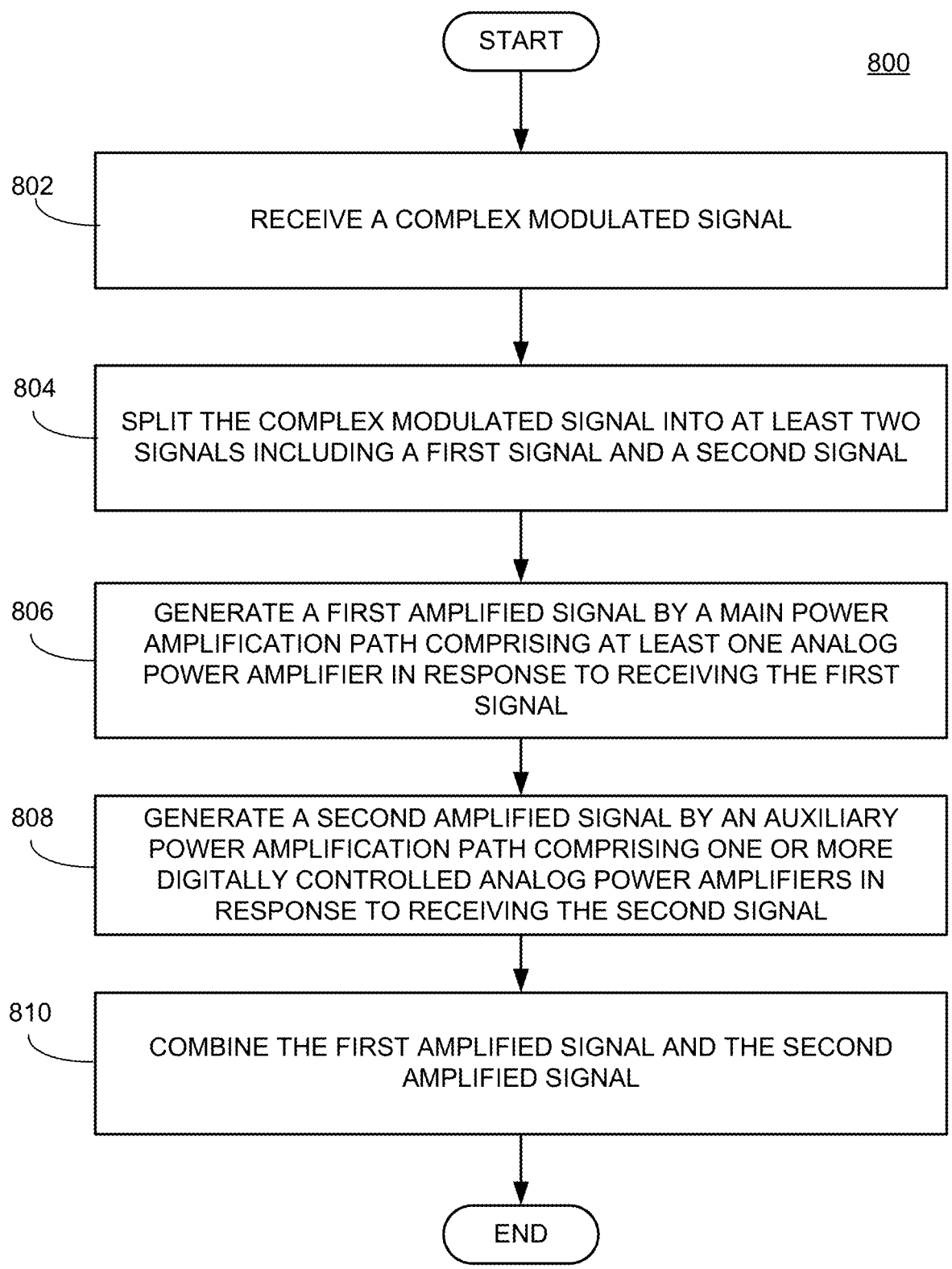
FIG. 24 is a flow chart of an exemplary method for generating an amplified signal using a mixed-signal power amplifier, according to an example embodiment.

FIG. 24 shows a flowchart of a method 800. According to some embodiments, method 800 may be performed using a mixed-signal power amplifier 100, as describe above with respect to FIG. 1.

In block 802, a complex modulated signal may be received by, for example, a mixed signal power amplifier 100.

In block 804, the complex modulated signal may be split into at least two signals including a first signal and a second signal. For example, in some embodiments, an input network 102 may split the signal complex modulated signal into two or more signals that have different phases.

In block 806, a first amplified signal may be generated by a main power amplification path 107 in response to receiving the first signal. In other words, the main power amplification path 107 may amply the first signal to generate the first amplified signal. As previously described above, a main power amplification path 107 may include at least one analog power amplifier.

In block 808, a second amplified signal may be generated by an auxiliary power amplification path 109a in response to receiving the second signal. In other words, the auxiliary power amplification path 109a may amply the second signal to generate the second amplified signal. As previously described above, an auxiliary power amplification path 107 may include at least one digitally controlled analog power amplifier.

In block 810, the first amplified signal and the second amplified signal may be combined. For example, the first amplified signal and the second amplified signal may be combined to form a single output signal 116. In some embodiments, the first amplified signal and the second amplified signal may be combined by an output network 115 as previously described above.

It will be understood that the various steps shown in FIG. 24 are illustrative only, and that steps may be removed, other steps may be used, or the order of steps may be modified.

Certain embodiments of the disclosed technology are described above with reference to block and flow diagrams of systems and/or methods according to example embodiments of the disclosed technology. Some blocks of the block diagrams and flow diagrams may not necessarily need to be performed in the order presented, or may not necessarily need to be performed at all, according to some embodiments of the disclosed technology.

While certain embodiments of the disclosed technology have been described in connection with what is presently considered to be the most practical embodiments, it is to be understood that the disclosed technology is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the disclosed technology, including the best mode, and also to enable any person skilled in the art to practice certain embodiments of the disclosed technology, including making and using any devices or systems and performing any incorporated methods. The patentable scope of certain embodiments of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A multi-path mixed-signal power amplifier system configured to amplify the frequency of a complex modulated signal, the multi-path mixed-signal power amplifier system comprising:
    mixed-signal power amplifiers, each comprising:
        an input network configured to split the complex modulated signal into a first signal and a second signal;
        a main power amplification path configured to receive the first signal and comprising an analog power amplifier configured to generate a first amplified signal;
        an auxiliary power amplification path configured to receive the second signal, and comprising a digitally controlled analog power amplifier configured to generate a second amplified signal; and
        an output network configured to combine the first amplified signal and the second amplified signal;
    wherein each mixed-signal power amplifier is configured to amplify the frequency of the complex modulated signal to fall within a desired output frequency band associated with each of the mixed-signal power amplifiers such that only one of the mixed-signal power amplifiers processes the complex modulated signal at a time based on the desired output frequency.

2. The multi-path mixed-signal power amplifier system of claim 1, wherein the first signal has a phase offset and/or amplitude offset from the second signal.

3. The multi-path mixed-signal power amplifier system of claim 1, wherein the main power amplification path of each mixed-signal power amplifier further comprises a digitally controlled analog power amplifier.

4. The multi-path mixed-signal power amplifier system of claim 3, wherein the digitally controlled analog power amplifier of the main power amplification path of each mixed-signal power amplifier is selectively switched on based on the amplitude of the first signal.

5. The multi-path mixed-signal power amplifier system of claim 1, wherein the auxiliary power amplification path of each mixed-signal power amplifier further comprises an analog power amplifier.

6. The multi-path mixed-signal power amplifier system of claim 1, wherein the output network of each mixed-signal power amplifier comprises a Doherty output network.

7. The multi-path mixed-signal power amplifier of claim 1, wherein each mixed-signal power amplifier further comprises a second auxiliary power amplification path;
    wherein the input network is configured to split the complex modulated signal into the first signal, the second signal, and a third signal; and
    wherein the second auxiliary power amplification path is configured to receive the third signal and comprises a digitally controlled analog power amplifier configured to generate a third amplified signal.

8. The multi-path mixed-signal power amplifier system of claim 1, wherein the digitally controlled analog power amplifier of the auxiliary power amplification path of each mixed-signal power amplifier is sequentially turned on in response to the amplitude of the input signal exceeding a predetermined threshold.

9. The multi-path mixed-signal power amplifier system of claim 1, wherein the complex modulated signal has a varying amplitude.

10. The multi-path mixed-signal power amplifier system of claim 9, wherein the combined first amplified signal and second amplified signal is substantially linear with respect to the complex modulated signal.

11. The multi-path mixed-signal power amplifier system of claim 1, wherein the main power amplification path and the auxiliary power amplification path of each mixed-signal power amplifier cooperate to achieve load modulation operations to increase power amplifier efficiency at power back-off modes and/or to increase power amplifier linearity.

12. The multi-path mixed-signal power amplifier system of claim 11, wherein the main power amplification path and the auxiliary power amplification path of each mixed-signal power amplifier cooperate together to achieve Doherty operation to increase power amplifier efficiency at power back-off modes and/or to increase power amplifier linearity.

13. A method comprising:
processing a complex modulated signal with a multi-path mixed-signal power amplifier system comprising mixed-signal power amplifiers arranged in parallel; and
outputting an amplified output signal;
wherein each mixed-signal power amplifier is configured to amplify the frequency of the complex modulated signal to fall within a desired output frequency band associated with each of the mixed-signal power amplifiers such that only one of the mixed-signal power amplifiers processes the complex modulated signal at a time based on the desired output frequency; and
wherein each mixed-signal power amplifier is configured to:
split, by an input network, the complex modulated signal into a first signal and a second signal;
generate, by a main power amplification path comprising an analog power amplifier in response to receiving the first signal, a first amplified signal;
generate, by an auxiliary power amplification path comprising a digitally controlled analog power amplifier in response to receiving the second signal, a second amplified signal; and
combine, by an output network, the first amplified signal and the second amplified signal.

14. The method of claim 13 further comprising selectively turning on the digitally controlled analog power amplifier based on the amplitude of the second signal.

15. The multi-path mixed-signal power amplifier system of claim 1, wherein the input network of each mixed-signal power amplifier comprises:
an input balun;
a differential quadrature hybrid;
matching networks;
driver stages; and
interstage matching networks.

16. The multi-path mixed-signal power amplifier system of claim 1 further comprising:
a radio transmitter system configured to output the complex modulated signal to the mixed-signal power amplifiers; and
an antenna configured to transmit the amplified output signal.

17. The multi-path mixed-signal power amplifier system of claim 1, wherein:
the input network of each mixed-signal power amplifier is configured to split the complex modulated signal into three or more signals, including the first signal and the second signal;
the main power amplification path of each mixed-signal power amplifier comprises two or more analog power amplifiers; and
the auxiliary power amplification path of each mixed-signal power amplifier comprises two or more digitally controlled analog power amplifiers.

18. The multi-path mixed-signal power amplifier system of claim 17, wherein the input network of each mixed-signal power amplifier comprises:
an input balun;
a differential quadrature hybrid;
matching networks;
driver stages; and
interstage matching networks.

19. A method comprising:
processing a complex modulated signal with a multi-path mixed-signal power amplifier system comprising mixed-signal power amplifiers arranged in parallel; and
outputting an amplified output signal;
wherein each mixed-signal power amplifier is configured to amplify the frequency of the complex modulated signal to fall within a desired output frequency band associated with each of the mixed-signal power amplifiers such that only one of the mixed-signal power amplifiers processes the complex modulated signal at a time based on the desired output frequency; and
wherein each mixed-signal power amplifier is configured to:
split, by an input network, the complex modulated signal into a first signal and a second signal, wherein the input network comprises an input balun, a differential quadrature hybrid, a pair of matching networks, a pair of driver stages, and a pair of interstage matching networks;
generate, by a main power amplification path comprising an analog power amplifier in response to receiving the first signal, a first amplified signal;
generate, by an auxiliary power amplification path comprising a digitally controlled analog power amplifier in response to receiving the second signal, a second amplified signal; and
combine, by an output network, the first amplified signal and the second amplified signal.

* * * * *